United States Patent
Choo et al.

(10) Patent No.: US 10,305,429 B2
(45) Date of Patent: May 28, 2019

(54) SUPPLY MODULATOR AND COMMUNICATION DEVICE INCLUDING THE SAME

(71) Applicant: SAMSUNG ELECTRONICS CO., LTD., Suwon-si (KR)

(72) Inventors: Young-hwan Choo, Hwaseong-si (KR); Ji-seon Paek, Suwon-si (KR); Dong-su Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/690,467

(22) Filed: Aug. 30, 2017

(65) Prior Publication Data

US 2018/0152144 A1   May 31, 2018

(30) Foreign Application Priority Data

Nov. 25, 2016   (KR) .................. 10-2016-0158050

(51) Int. Cl.
| | |
|---|---|
| *H03G 3/20* | (2006.01) |
| *H03F 1/02* | (2006.01) |
| *H03F 3/19* | (2006.01) |
| *H03F 3/21* | (2006.01) |
| *H04B 1/16* | (2006.01) |
| *H03F 3/24* | (2006.01) |

(Continued)

(52) U.S. Cl.
CPC ......... *H03F 1/0216* (2013.01); *H03F 1/0227* (2013.01); *H03F 3/19* (2013.01); *H03F 3/211* (2013.01); *H03F 3/245* (2013.01); *H03F 3/68* (2013.01); *H04B 1/0483* (2013.01); *H04B 1/1607* (2013.01); *H03F 2200/102* (2013.01); *H03F 2200/105* (2013.01); *H03F 2200/451* (2013.01); *H04B 1/04* (2013.01)

(58) Field of Classification Search
CPC ..... H03F 1/0211; H03F 1/0222; H03F 1/0238
USPC .......................................... 330/127, 136, 297
See application file for complete search history.

(56) References Cited

U.S. PATENT DOCUMENTS

| | | |
|---|---|---|
| 8,981,847 B2 | 3/2015 | Balteanu |
| 9,077,293 B2 | 7/2015 | Wimpenny |

(Continued)

FOREIGN PATENT DOCUMENTS

| | | |
|---|---|---|
| KR | 1020140121868 A | 10/2014 |
| KR | 1020150039240 A | 4/2015 |

(Continued)

*Primary Examiner* — Steven J Mottola
(74) *Attorney, Agent, or Firm* — Sughrue Mion, PLLC

(57) ABSTRACT

A supply modulator for providing a first power supply voltage and a second power supply voltage to a first power amplifier and a second power amplifier, respectively, includes a first modulation circuit including a linear regulator and a switching regulator, the first modulation circuit being configured to generate a first modulation voltage in accordance with envelope tracking, and provide the first modulation voltage to the first power amplifier as the first power supply voltage; and a single inductor multiple output converter configured to generate a first output voltage and a second output voltage based on an input voltage having a fixed level, provide the first output voltage to the linear regulator of the first modulation circuit as a power supply voltage, and provide the second output voltage to the second power amplifier as the second power supply voltage.

20 Claims, 24 Drawing Sheets

(51) Int. Cl.
*H03F 3/68* (2006.01)
*H04B 1/04* (2006.01)

(56) References Cited

U.S. PATENT DOCUMENTS

| | | |
|---|---|---|
| 9,143,096 B2 | 9/2015 | Balteanu et al. |
| 9,407,476 B2 | 8/2016 | Lim et al. |
| 9,614,477 B1 * | 4/2017 | Rozenblit ............. H03F 1/0227 |
| 2015/0091645 A1 | 4/2015 | Park et al. |
| 2015/0194936 A1 | 7/2015 | Inanoglu et al. |
| 2016/0094192 A1 | 3/2016 | Khesbak et al. |
| 2016/0099686 A1 * | 4/2016 | Perreault ................ H03G 3/004 330/296 |

FOREIGN PATENT DOCUMENTS

| | | |
|---|---|---|
| KR | 1020150040088 A | 4/2015 |
| KR | 1020160036493 A | 4/2016 |

* cited by examiner

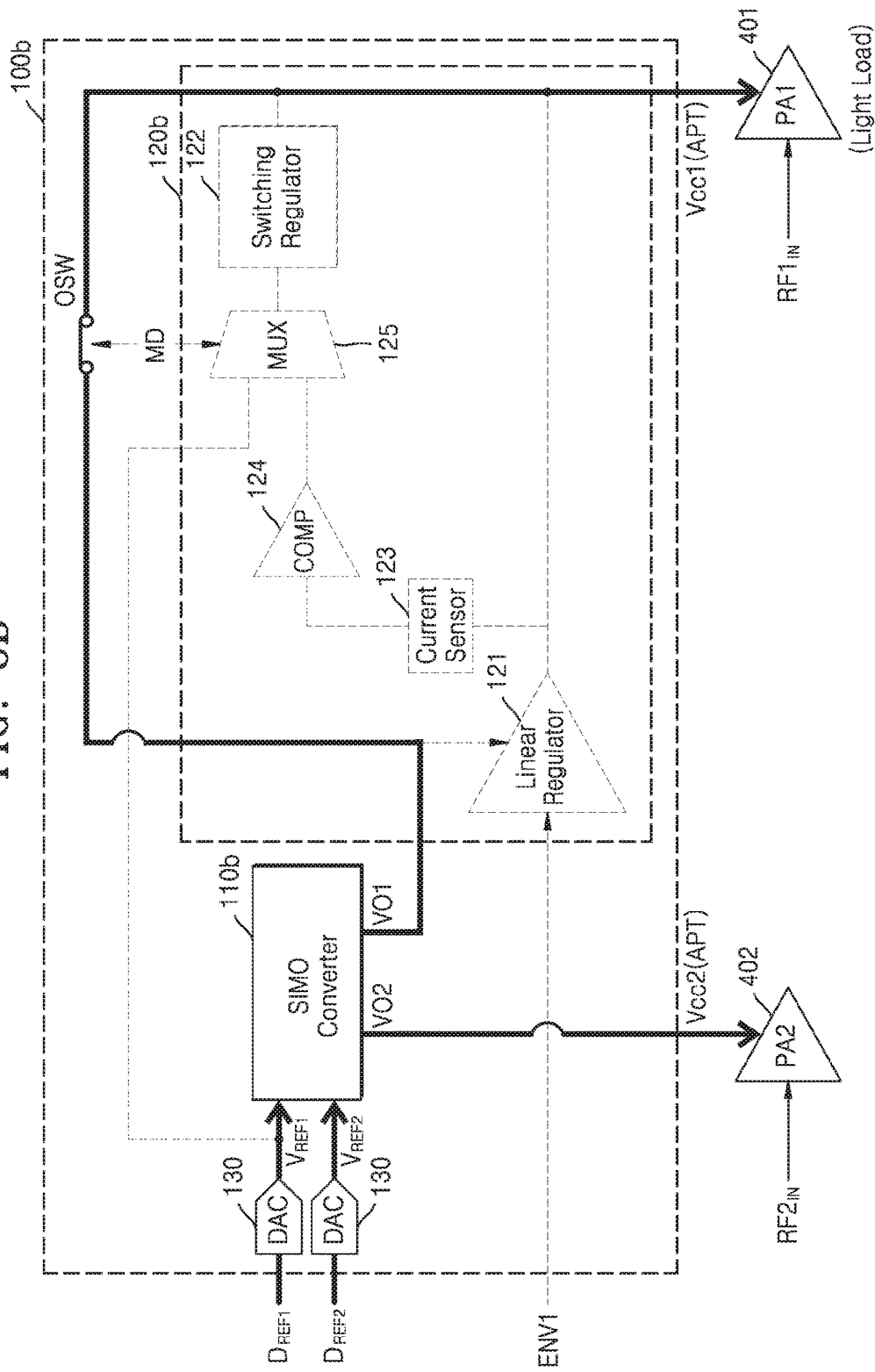

SUPPLY MODULATOR AND COMMUNICATION DEVICE INCLUDING THE SAME

CROSS-REFERENCE TO RELATED APPLICATION

This application claims priority from Korean Patent Application No. 10-2016-0158050, filed on Nov. 25, 2016, in the Korean Intellectual Property Office, the disclosure of which is incorporated herein by reference in its entirety.

BACKGROUND

Methods and apparatuses consistent with example embodiments relate to a communication device, and more particularly, a supply modulator, which is used in a wireless transmitter, and a communication device including the supply modulator.

Wireless communication devices such as smartphones, tablets, and Internet of Things (IoT) devices use Wideband Code Multiple Access (WCDMA) (3G), Long-Term Evolution (LTE), and LTE Advanced (4G) technology for high speed communication. As communication technology has advanced, transmission and reception signals having a higher peak-to-average power ratio (PAPR) and a greater bandwidth capacity are required. In order to increase the power efficiency of a power amplifier having a high PAPR and a wide bandwidth, Average Power Tracking (APT) or Envelope Tracking (ET) is used. A chip that supports the APT technique or ET technique is referred to as a supply modulator (SM).

SUMMARY

One or more example embodiments provide a supply modulator that supports power modulation for a plurality of transmission power amplifiers at the same time.

According to an aspect of an example embodiment, there is provided a supply modulator for providing a first power supply voltage and a second power supply voltage to a first power amplifier and a second power amplifier, respectively, which operate simultaneously, the supply modulator including: a first modulation circuit including a linear regulator and a switching regulator, the first modulation circuit being configured to generate a first modulation voltage in accordance with envelope tracking, and provide the first modulation voltage to the first power amplifier as the first power supply voltage; and a single inductor multiple output (SIMO) converter configured to generate a first output voltage and a second output voltage based on an input voltage having a fixed level, provide the first output voltage to the linear regulator of the first modulation circuit, and provide the second output voltage to the second power amplifier as the second power supply voltage.

According to an aspect of another example embodiment, there is provided a supply modulator including: a plurality of modulation circuits configured to generate a plurality of modulation voltages provided as power supply voltages to a plurality of power amplifiers, each of the plurality of modulation circuits including a linear regulator and a switching regulator which are used for power modulation according to envelope tracking; and a single inductor multiple output (SIMO) converter configured to generate a plurality of output voltages by direct current/direct current (DC/DC) conversion of an input voltage on a time-division basis and provide the plurality of output voltages as power supply voltages to a linear regulator of a corresponding modulation circuit of the plurality of modulation circuits.

According to an aspect of yet another example embodiment, there is provided a communication device including: a modem configured to generate an envelope signal corresponding to at least one of a plurality of transmission signals; a radio frequency (RF) block configured to generate a plurality of RF signals corresponding to a plurality of carriers; a plurality of power amplifiers configured to power-amplify the plurality of RF signals based on a dynamically varying power supply voltage; and a supply modulator comprising a single inductor multiple output (SIMO) converter configured to generate a plurality of output voltages, and a modulation circuit configured to receive one of the plurality of output voltages as an input power supply voltage and generate a modulation voltage based on the envelope signal, the supply modulator being configured to provide the modulation voltage to one of the plurality of power amplifiers and provide another one of the plurality of output voltages to another one of the plurality of power amplifiers.

According to an aspect of still another example embodiment, there is provided a modulation circuit configured to provide a power supply voltage to an amplifier, the supply modulator including: a linear regulator configured to receive an output voltage from a single indictor multiple output (SIMO) converter; a comparator configured to sense an output current of the linear regulator and generate a comparison result; a multiplexer configured to selectively output, as an output of the multiplexer, one among a reference voltage and the comparison result based on a mode signal; and a switch controller configured to control an output current of the modulation circuit based on the an output of the multiplexer.

BRIEF DESCRIPTION OF THE DRAWINGS

Example embodiments will be more clearly understood from the following detailed description taken in conjunction with the accompanying drawings in which:

FIG. 8B shows an example of a supply modulator operation when a power supply voltage according to the APT is provided to a power amplifier;

DETAILED DESCRIPTION OF EXAMPLE EMBODIMENTS

Hereinafter, example embodiments will be described in detail with reference to the accompanying drawings.

Figure 1:
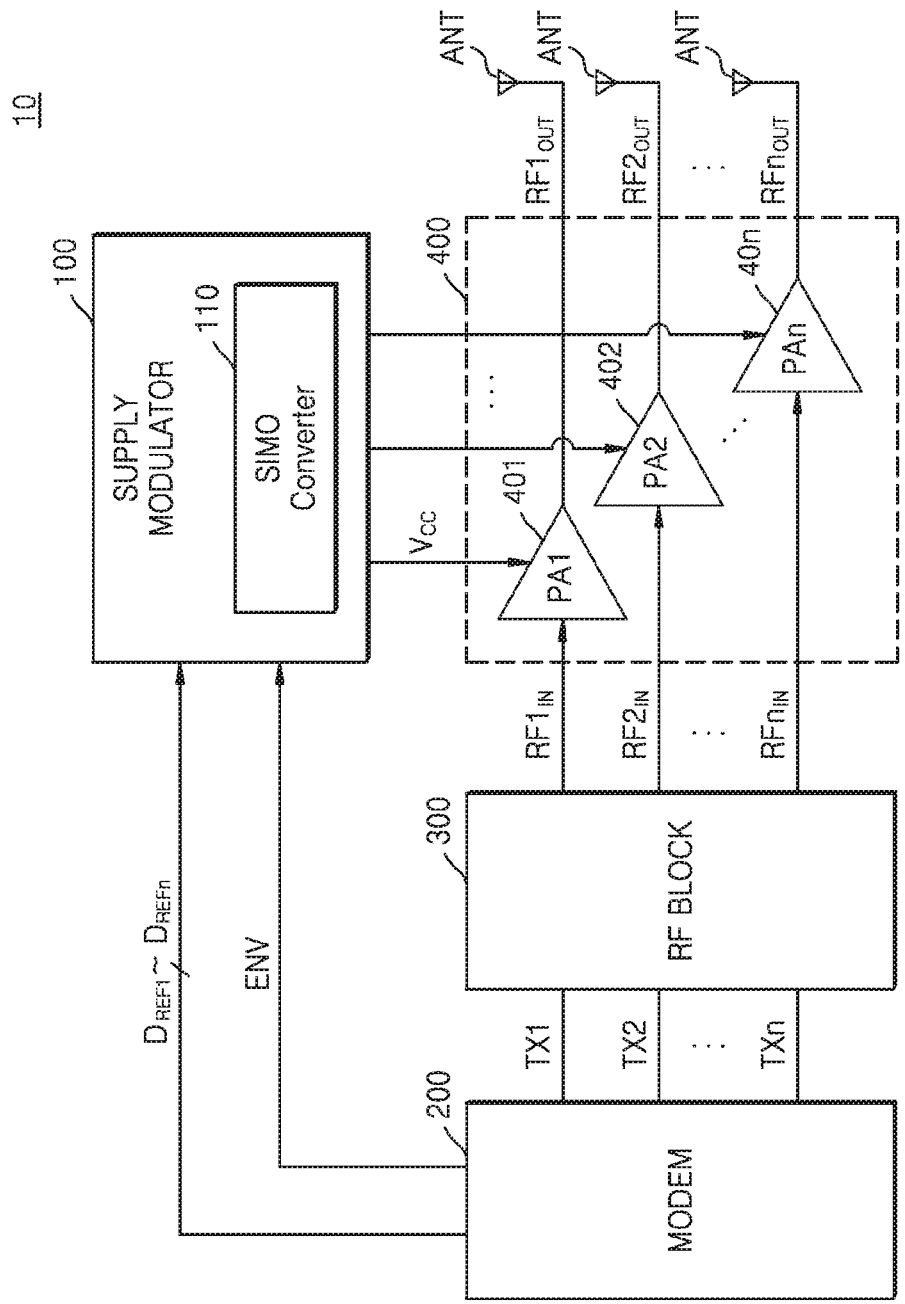
FIG. 1 is a block diagram of a transmitting device according to an example embodiment.

FIG. 1 is a block diagram of a transmitting device 10 according to an example embodiment.

The transmitting device 10, which is a wireless transmitter, may be mounted in a wireless communication system and transmit data to an external device. The transmitting device 10 may transmit a transmission signal through a plurality of frequency bands by using Carrier Aggregation (CA). To this end, the transmitting device 10 may include a plurality of power amplifiers for power-amplifying a plurality of radio frequency (RF) input signals corresponding to a plurality of carriers.

Referring to FIG. 1, the transmitting device 10 may include a modem 200, a supply modulator 100, an RF block 300, and a power amplifying unit 400. The power amplifying unit 400 may include a plurality of power amplifiers 401 to 40n respectively corresponding to a plurality of carriers.

The modem 200 may process a baseband signal including information to be transmitted according to a communication scheme. For example, the modem 200 may process a signal to be transmitted according to a communication scheme such as Orthogonal Frequency Division Multiplexing (OFDM), Orthogonal Frequency Division Multiple Access (OFDMA), Wideband Code Multiple Access (WCDMA), and High Speed Packet Access+ (HSPA+). In addition, the modem 200 may process signals according to various types of communication schemes to which a technique of modulating the amplitude and frequency of a transmission signal is applied.

The modem 200 may generate a plurality of transmission signals TX1 to TXn from a plurality of baseband signals including information to be transmitted through each of the plurality of carriers. Also, the modem 200 may detect an envelope of a plurality of baseband signals, and generate an envelope signal ENV and a plurality of average power signals $D_{REF1}$ to $D_{REFn}$. The envelope signal ENV and the plurality of average power signals $D_{REF1}$ to $D_{REFn}$ may correspond to amplitude components of the plurality of transmission signals TX1 to TXn. The plurality of average power signals $D_{REF1}$ to $D_{REFn}$ may be provided as reference voltages to the supply modulator 100. Although FIG. 1 shows an example in which one envelope signal ENV is generated, example embodiments are not limited thereto and a plurality of envelope signals ENV may be generated. In addition, in an example embodiment, the plurality of the transmission signals TX1 to TXn and the envelope signal ENV may be differential signals, each including a positive signal and a negative signal.

The plurality of transmission signals TX1 to TXn and the envelope signal ENV, output from the modem 200, may be analog signals, and the plurality of average power signals $D_{REF1}$ to $D_{REFn}$ may be digital signals. The modem 200 may perform digital-to-analog conversion on a plurality of baseband signals and a digital envelope signal for the plurality of baseband signals by using a digital-to-analog converter (DAC) provided in the modem 200, thereby generating the plurality of transmission signals TX1 to TXn and the envelope signal ENV, which are analog signals. The plurality of average power signals $D_{REF1}$ to $D_{REFn}$ output from the modem 200 may be converted into an analog signal, e.g., a plurality of reference voltages, via a DAC provided in the supply modulator 100. In an example embodiment, the DAC provided in the modem 200 may operate at a relatively higher speed than the DAC provided in the supply modulator 100.

However, example embodiments are not limited thereto, and the modem 200 may convert the plurality of average power signals $D_{REF1}$ to $D_{REFn}$ into analog signals and output the analog signals. The plurality of average power analog signals $D_{REF1}$ to $D_{REFn}$ may be provided as a plurality of reference voltages to the supply modulator 100.

The RF block 300 may generate a plurality of RF input signals $RF1_{IN}$ to $RFn_{IN}$ by frequency up-converting each of the plurality of transmission signals TX1 to TXn based on a corresponding carrier of a plurality of carriers.

The power amplifying unit 400 includes the plurality of power amplifiers 401 to 40n, and may amplify the power of the plurality of RF input signals $RF1_{IN}$ to $RFn_{IN}$ to generate a plurality of RF output signals $RF1_{OUT}$ to $RFn_{OUT}$. Each of the plurality of power amplifiers 401 to 40n may amplify the power of a received RF input signal based on an applied power supply voltage. The plurality of RF output signals $RF1_{OUT}$ to $RFn_{OUT}$ may be transmitted via an antenna ANT.

The supply modulator 100 may generate modulated voltages having levels that dynamically vary, based on the envelope signal ENV and the plurality of average power signals $D_{REF1}$ to $D_{REFn}$, and may supply the modulated voltages to the power amplifiers 401 to 40n as power supply voltages.

The efficiency of a power amplifier (e.g., each of the power amplifiers 401 to 40n) is lowered when a power supply voltage having a fixed level is applied to a power amplifier. For efficient power management of the power amplifier, the supply modulator 100 may modulate an input voltage (e.g., power supplied from a battery) based on the envelope signal ENV and/or an average power signal (e.g., one of the average power signals $D_{REF1}$ to $D_{REFn}$), generated based on the amplitude components of the transmission signals TX1 to TXn, and may provide the modulated input voltage (i.e., the modulated power) as a power supply voltage to the power amplifier.

The supply modulator 100 may include a single inductor multiple output (SIMO) converter 110. The SIMO converter 110 may generate a plurality of output voltages by direct current/direct current (DC/DC) conversion of an input voltage. The supply modulator 100 may provide, as power supply voltages, the plurality of output voltages of the SIMO converter 110 or modulation voltages generated based on the plurality of output voltages to the plurality of power amplifiers 401 to 40n, respectively. Accordingly, the transmitting device 10 according to the example embodiment allows one supply modulator 100 including the SIMO converter 110 to supply power supply voltages to the plurality of power amplifiers 401 to 40n at the same time.

In contrast, a conventional conversion circuit requires a conversion circuit in order to simultaneously supply a power supply voltage to each of the plurality of power amplifiers 401 to 40n. In this case, as an inductor is added, the layout area of the supply modulator 100 may increase and the price of the supply modulator 100 may increase. However, according to the transmitting device 10 according to the example embodiment, by supporting the power modulation of the plurality of power amplifiers 401 to 40n by using the SIMO converter 110, a power supply voltage may be simultaneously supplied to each of the plurality of power amplifiers 401 to 40n without increasing the layout area and price of the supply modulator 100.

Figure 2:
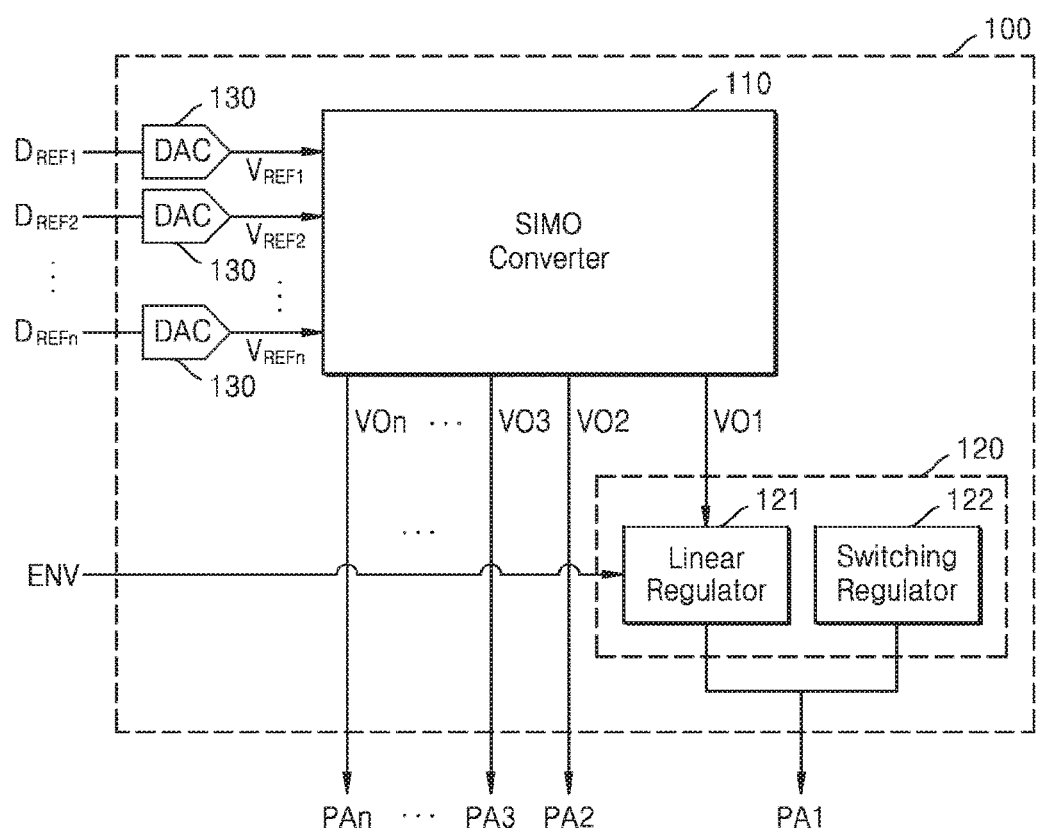
FIG. 2 is a block diagram of a supply modulator according to an example embodiment.

FIG. 2 is a block diagram schematically illustrating a supply modulator 100 according to an example embodiment. The supply modulator 100 of FIG. 2 may be applied to the transmitting device 10 of FIG. 1.

Referring to FIG. 2, the supply modulator 100 may include an SIMO converter 110, a modulation circuit 120, and a plurality of DACs 130. Although FIG. 2 shows an example in which the supply modulator 100 includes one modulation circuit 120, example embodiments are not limited thereto and the supply modulator 100 may include a plurality of modulation circuits 120.

A plurality of average power signals $D_{REF1}$ to $D_{REFn}$ provided from the modem 200 of FIG. 1 may be respectively converted into analog signals, i.e., a plurality of reference voltages $V_{REF1}$ to $V_{REFn}$ via the DACs 130. The SIMO converter 110 may generate a plurality of output power sources, for example, a plurality of output voltages VO1 to VOn, based on the plurality of reference voltages $V_{REF1}$ to $V_{REFn}$. The SIMO converter 110 may generate the plurality of output voltages VO1 to VOn by boosting or stepping-down an input voltage based on the plurality of reference voltages $V_{REF1}$ to $V_{REFn}$. As described above with reference to FIG. 1, the plurality of reference voltages $V_{REF1}$ to $V_{REFn}$ may represent amplitude components of transmission signals provided to a plurality of power amplifiers PA1 to PAn. For example, the plurality of reference voltages $V_{REF1}$ to $V_{REFn}$ may be generated based on a peak level of an envelope of the transmission signals for each Transmission Time Interval (TTI) of the transmission signals. Therefore, the levels of the plurality of reference voltages $V_{REF1}$ to $V_{REFn}$ may vary for each TTI, and the levels of the plurality of output voltages VO1 to VOn may also vary for each TTI, corresponding to the plurality of reference voltages $V_{REF1}$ to $V_{REFn}$. As such, the levels of the plurality of output voltages VO1 to VOn may be dynamically changed based on the envelope of the transmission signals.

The SIMO converter 110 may provide one output power source, for example, a first output voltage VO1, as a power supply voltage to a linear regulator 121 of the modulation circuit 120. Also, the SIMO converter 110 may provide at least one other output power source, for example, second to n-th output voltages VO2 to VOn, to at least one power amplifier, for example, second to n-th power amplifiers PA2 to PAn.

The modulation circuit 120 may have a hybrid structure including a linear regulator 121 and a switching regulator 122 and may be referred to as a hybrid modulation circuit.

The modulation circuit 120 may provide a modulation voltage according to Envelope Tracking (ET) or Average Power Tracking (APT) to a power amplifier, for example, a first power amplifier PA1.

When the ET is applied, the linear regulator 121 and the switching regulator 122 may operate together to generate a modulation voltage. The linear regulator 121 may perform the ET based on a power supply voltage provided from the SIMO converter 110 and a received envelope signal ENV. The output of the linear regulator 121 and the output of the switching regulator 122 may be summed and the summed output may be provided as a power supply voltage to a power amplifier, for example, the first power amplifier PA1.

When the APT is applied, the linear regulator 121 is turned off and the switching regulator 122 may generate the modulation voltage provided to the first power amplifier PA1. This will be described in detail with reference to FIGS. 5A, 5B, 6A, 6B and 6C below.

In an example embodiment, when the APT is applied, the modulation circuit 120 stops operating and the SIMO converter 110 may directly provide the first output voltage VO1 to the first power amplifier PA1.

In an example embodiment, the supply modulator 100 may include at least two modulation circuits 120 and the SIMO converter 110 may provide at least two output voltages as power supply voltages to at least two linear regulators 121 included in the at least two modulation circuits 120. The SIMO converter 110 may also directly provide at least one other output voltage as a power supply voltage to at least one power amplifier.

Thus, the supply modulator 100 may provide a modulation voltage according to the ET or APT to some of the plurality of power amplifiers PA1 to PAn, and may provide a modulation voltage according to the APT to other power amplifiers. Power supply voltages provided to the plurality of power amplifiers PA1 to PAn may be generated based on the plurality of output voltages VO1 to VOn of the SIMO converter 110.

Figure 3A:
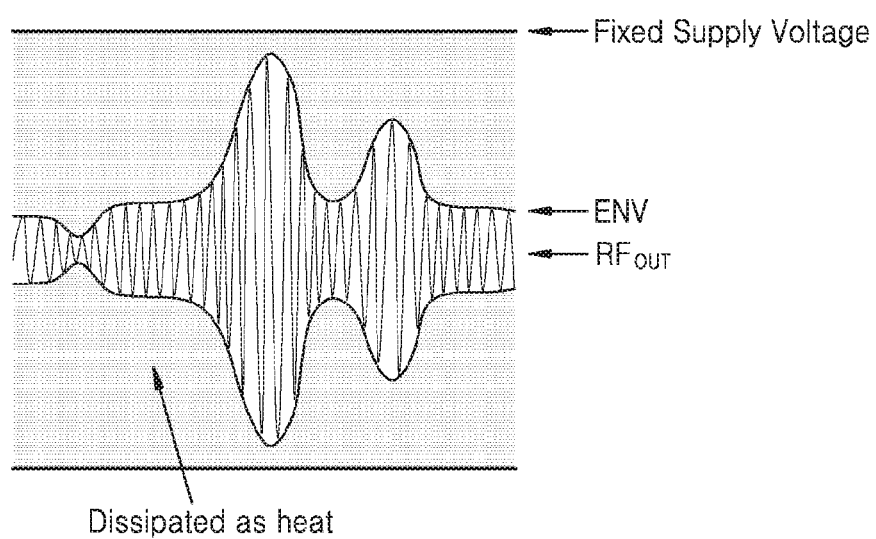
FIGS. 3A, 3B and 3C show waveforms of power supply voltages and output signals of power amplifiers.
Figure 3B:
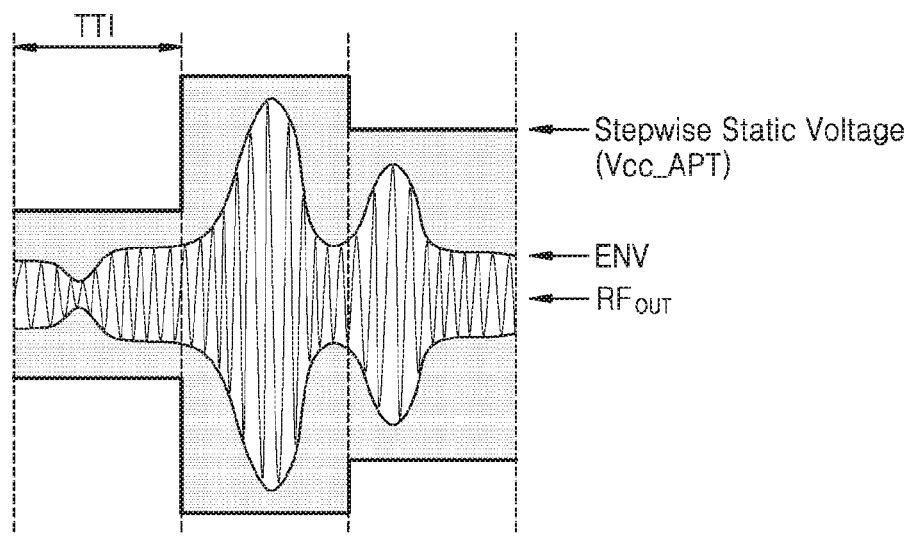
Figure 3C:
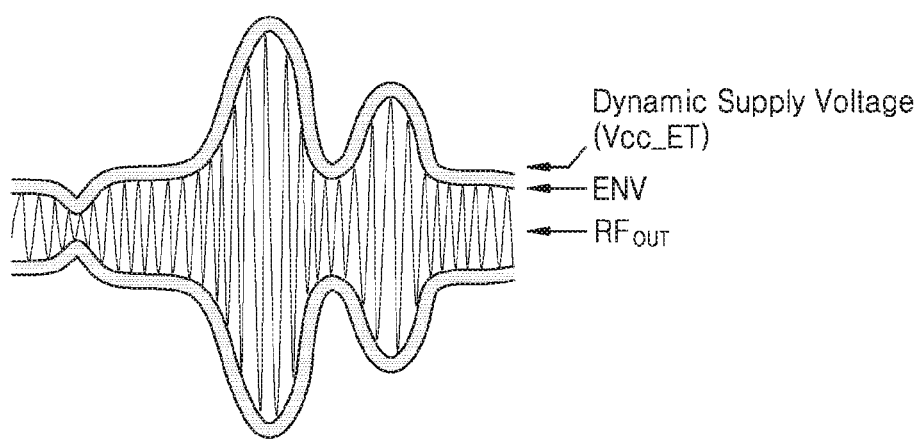

FIGS. 3A, 3B and 3C show waveforms of power supply voltages and output signals of power amplifiers. FIG. 3A shows an output waveform of a power amplifier receiving a fixed power supply voltage. FIGS. 3B and 3C show output waveforms of power amplifiers receiving variable power supply voltages based on an envelope of a transmission signal provided by the supply modulator 100 of FIG. 2, according to example embodiments.

Referring to FIG. 3A, when a power amplifier operates by receiving a fixed power supply voltage, for example, a battery voltage, as a power supply voltage, a voltage difference between an output signal $RF_{OUT}$ and the fixed power supply voltage may be relatively large. This voltage difference may reduce battery life and generate heat.

Referring to FIG. 3B, the APT is a technique for applying a modulation voltage, which varies based on a peak level of an envelope for each predetermined TTI, to a power amplifier. Referring to FIG. 3C, the ET is a technique for applying a modulation voltage, which instantaneously follows a level of an envelope, to a power amplifier.

The supply modulator 100 according to the present example embodiment may provide a power source Vcc_APT, which varies according to average power tracking as shown in FIG. 3B, or a power source Vcc_ET, which varies according to envelope tracking as shown in FIG. 3C, to a power amplifier as a power supply voltage. Accordingly, by reducing a voltage difference between the output signal RF$_{OUT}$ of the power amplifier and the power supply voltage, it is possible to minimize energy waste and increase battery life.

The power efficiency of the power amplifier is higher in the ET than in the APT. However, the power efficiency of the supply modulator 100 is higher in the APT than in the ET. The power efficiency of the whole system, e.g., the efficiency of the transmitting device 10 of FIG. 1, may be proportional to the product of the efficiency of the supply modulator 100 and the efficiency of the power amplifiers PA1 to PAn. Accordingly, the power efficiency of the whole system is such that the power efficiency of the ET is relatively high in a high-power region, in which the level of the output signal RF$_{OUT}$ is relatively high, and the power efficiency of the APT is relatively high in a low power region in which the level of the output signal RF$_{OUT}$ is relatively low. Therefore, the modulation circuit 120 of FIG. 2 may generate a modulation voltage according to one selected from the ET and the APT according to the level of an envelope of a transmission signal.

As described above with reference to FIG. 2, the supply modulator 100 according to the present example embodiment is configured such that the modulation circuit 120 having a hybrid structure provides a variable power supply voltage according to the ET or APT to at least one power amplifier, for example, the first power amplifier PA1, and thus, the efficiency of the supply modulator 100 may be increased.

Figure 4A:
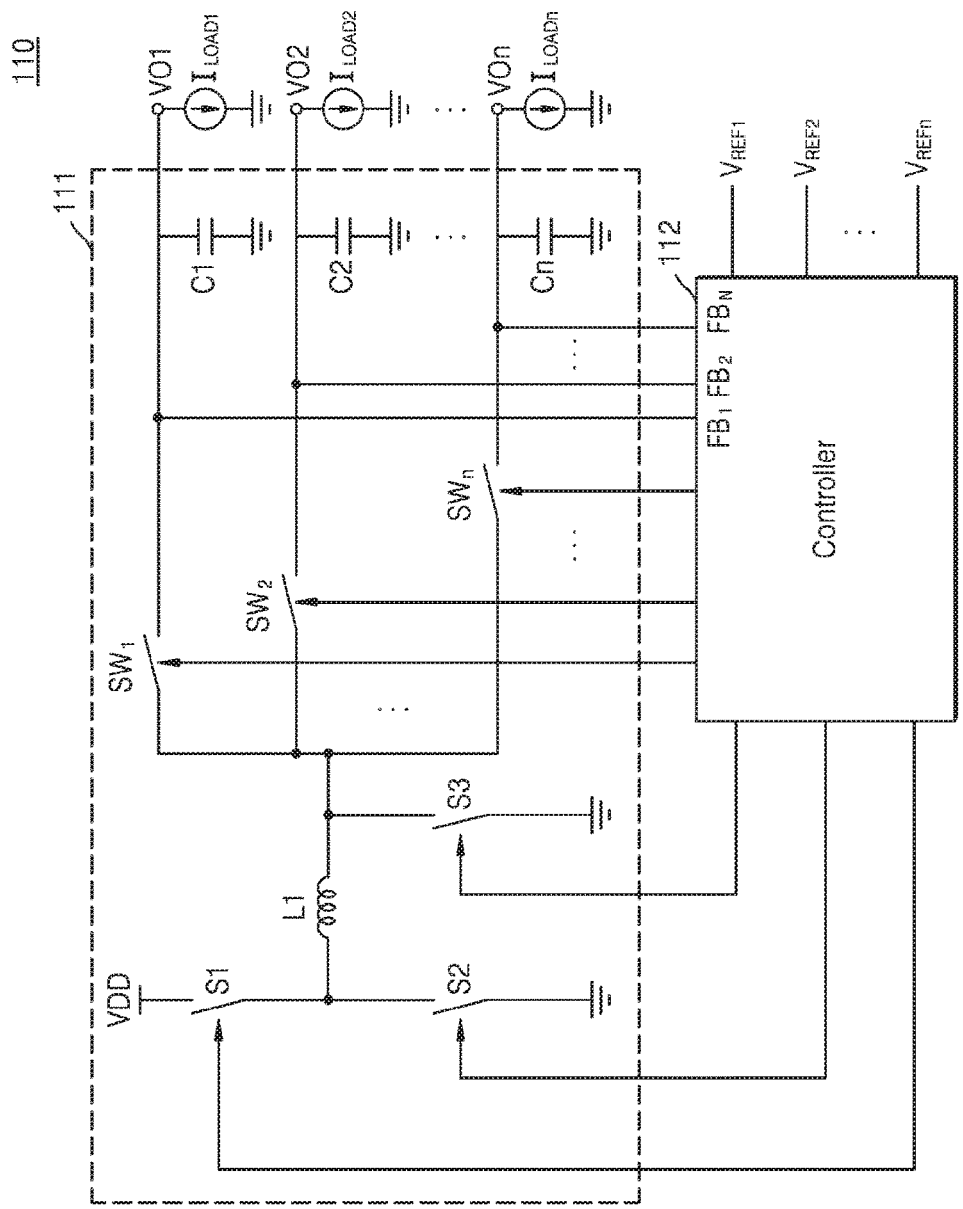
FIG. 4A is a diagram illustrating a single inductor multiple output (SIMO) converter according to an example embodiment.
Figure 4B:
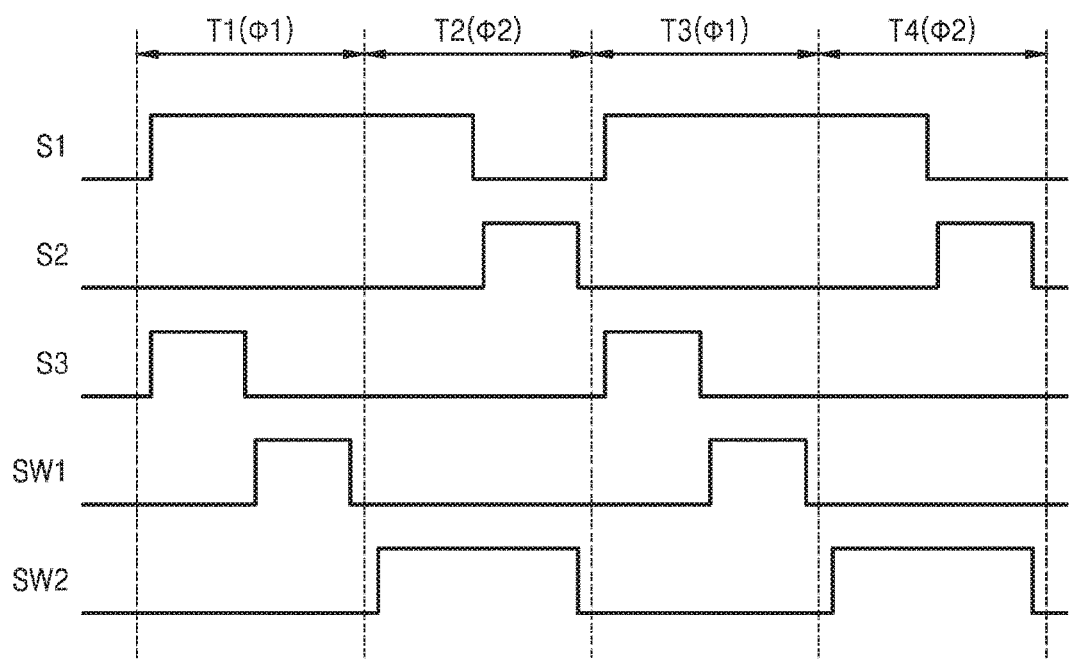
FIG. 4B is a timing diagram of the SIMO converter of FIG. 4A according to an example embodiment.

FIG. 4A is a diagram illustrating an SIMO converter 110 according to an example embodiment, and FIG. 4B is a timing diagram of the SIMO converter 110 of FIG. 4A.

Referring to FIG. 4A, the SIMO converter 110 may include a conversion circuit 111 and a controller 112. The conversion circuit 111 may include one inductor L, a plurality of conversion switches S1, S2, and S3, a plurality of output switches SW$_1$, SW$_2$, ..., and SW$_n$, and a plurality of capacitors C1, C2, ..., and Cn. The conversion circuit 111 may be implemented as a buck-boosting converter that steps-down or boosts an input voltage VDD, as shown in FIG. 4A. The conversion circuit 111 may generate a plurality of output voltages VO1 to VOn on a time-division basis under the control of the controller 112. The plurality of capacitors C1 to Cn may keep the levels of the plurality of output voltages VO1 to VOn constant. For example, the capacitance of the plurality of capacitors C1 to Cn may be several to several hundred microfarads.

The controller 112 may generate switching control signals to turn the plurality of conversion switches S1, S2, and S3 and the plurality of output switches SW1 to SWn on or off based on a plurality of reference voltages V$_{REF1}$ to V$_{REFn}$. The plurality of output voltages VO1 to VOn may be generated in accordance with states of the plurality of conversion switches S1, S2, and S3 and the plurality of output switches SW1 to SWn. The controller 112 may control the switching control signals by using pulse width modulation (PWM), pulse frequency modulation (PFM), or the like based on the plurality of reference voltages V$_{REF1}$ to V$_{REFn}$ to generate the plurality of output voltages VO1 to VOn with desired levels. The controller 112 may adjust the switching control signals so that the levels of the plurality of output voltages VO1 to VOn are desired levels by feeding back the levels of the plurality of output voltages VO1 to VOn.

The operation of the SIMO converter 110 will be described with reference to FIG. 4B. For convenience of explanation, it is assumed that the first and second output switches SW1 and SW2 are operated, and the SIMO converter 110 generates two output voltages VO1 and V02, as shown in FIG. 4B. In FIG. 4B, when the levels of signals applied to the conversion switches S1, S2, and S3 and the output switches SW1 and SW2 are high, the conversion switches S1, S2, and S3 and the output switches SW1 and SW2 are turned on.

Referring to FIG. 4B, the operation of the SIMO converter 110 may be divided into two phases, φ1 and φ2. The first output voltage VO1 may be generated in the first phase φ1 and the second output voltage VO2 may be generated in the second phase φ2. In the first phase φ1, the first conversion switch S1 is turned on, the third conversion switch S3 is turned on and then turned off, and the first output switch SW1 is turned on, and thus, the first output voltage VO1, which is obtained by the boost of the input voltage VDD, may be generated. In the second phase φ2, the first conversion switch S1 is turned on and then turned off and when the first conversion switch S1 is turned off, the second conversion switch S2 is turned on. In this case, as the second output switch SW2 is turned on, the second output voltage VO2, which is obtained by stepping-down the input voltage VDD, may be generated. Therefore, the first output voltage VO1 may be generated in a first period T1 and a third period T3, and the second output voltage VO2 may generated in a second period T2 and a fourth period T4. In this manner, the SIMO converter 110 may generate a plurality of output voltages on a time-division basis.

Although an example in which the SIMO converter 110 performs different operations in the two phases φ1 and φ2, i.e., a boosting operation and a step-down operation, has been described with reference to FIG. 4B, example embodiments are not limited thereto. For example, the SIMO converter 110 may perform the same operation in different phases. In addition, although FIG. 4B shows an example in which the first to fourth periods T1 to T4 are equal to each other, example embodiments are not limited thereto. For example, the length of each of the first to fourth periods T1 to T4 may vary based on a target level and/or a feedback level of the plurality of output voltages VO1 to VOn.

Above, an implementation example and an operation example of the SIMO converter 110 have been described with reference to FIGS. 4A and 4B. However, the structure and operation of the SIMO converter 110 may be variously modified.

Figure 5A:
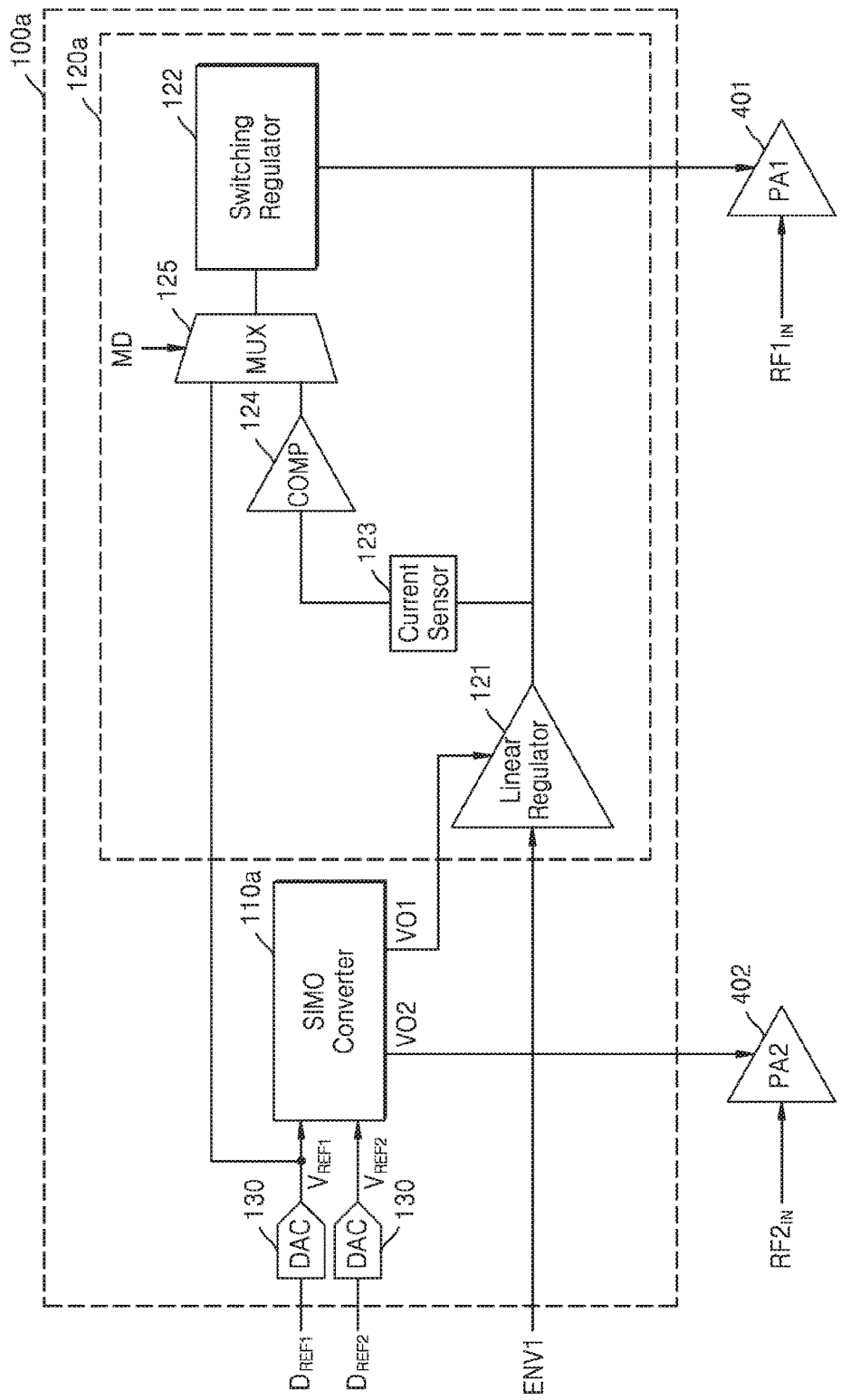
FIG. 5A is a block diagram illustrating a supply modulator according to an example embodiment.
Figure 5B:
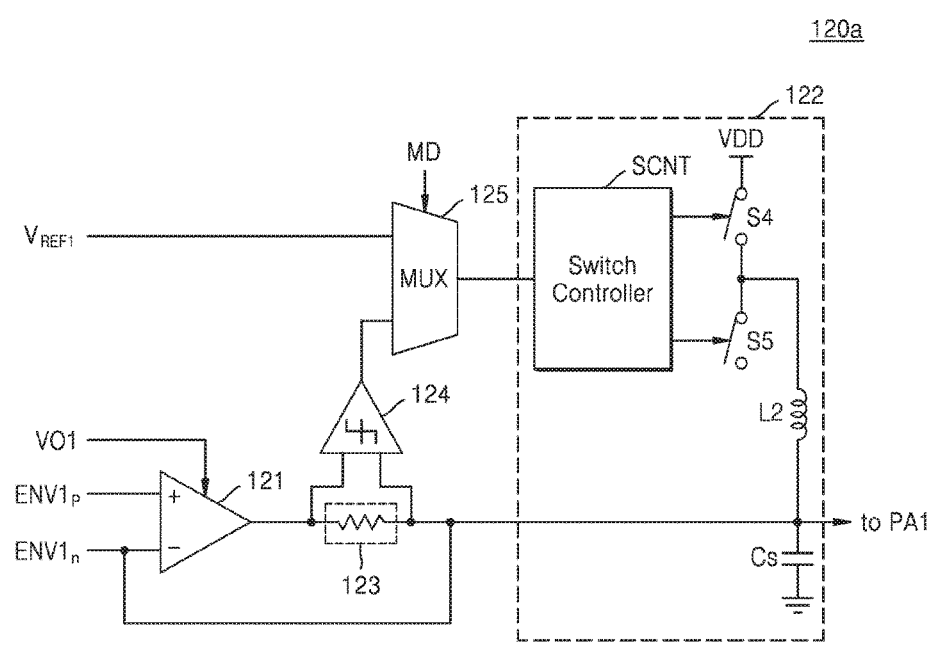
FIG. 5B is a circuit diagram illustrating a modulation circuit of FIG. 5A in more detail.

FIG. 5A is a block diagram illustrating an example of a supply modulator 100a according to an example embodiment, and FIG. 5B is a circuit diagram illustrating a modulation circuit of FIG. 5A in more detail. For convenience of explanation, first and second power amplifiers 401 and 402 are also shown in FIG. 5A.

FIG. 5A shows a structure of a supply modulator that provides a power supply voltage according to the ET or APT to one power amplifier, for example, a first power amplifier 401, and provides a power supply voltage according to the APT to another power amplifier, for example, a second power amplifier 402. In this case, a mode signal MD indicating an ET mode or an APT mode may be provided from the modem 200 in FIG. 1. However, example embodiments are not limited thereto, and the supply modulator 100a may include a control logic therein and the control logic may determine a mode based on average power signals and generate the mode signal MD according to the determined mode.

Referring to FIG. 5A, the supply modulator 100a includes a plurality of DACs 130, an SIMO converter 110a, and a modulation circuit 120a.

The supply modulator 100a may receive a first envelope signal ENV1, a first average power signal $D_{REF1}$ and a second average power signal $D_{REF2}$ from the modem 200 in FIG. 1. The first average power signal $D_{REF1}$ and the second average power signal $D_{REF2}$ may be respectively converted into analog signals through the DACs 130. For example, the first average power signal $D_{REF1}$ and the second average power signal $D_{REF2}$ may be converted into a first reference voltage $V_{REF1}$ and a second reference voltage $V_{REF2}$. The first envelope signal ENV1 may be a differential signal including a positive signal ENV1p and a negative signal ENV1n, as shown in FIG. 5B.

The SIMO converter 110a generates a first output voltage VO1 and a second output voltage VO2 based on the first reference voltage $V_{REF1}$ and the second reference voltage $V_{REF2}$. The first and second reference voltages $V_{REF1}$ and $V_{REF2}$ may represent amplitude components of transmission signals provided to the plurality of power amplifiers PA1 to PAn, and the levels of the first and second reference voltages $V_{REF1}$ and $V_{REF2}$ may vary for each TTI. Therefore, the first output voltage VO1 and the second output voltage VO2 may be referred to as modulated voltages according to the APT.

The SIMO converter 110a may provide the first output voltage VO1 as a power supply voltage to a linear regulator 121 of the modulation circuit 120a and provide the second output voltage VO2 as a power supply voltage of the second output amplifier 402. Therefore, a power supply voltage according to the APT may be provided to the second power amplifier 402.

The modulation circuit 120a may include the linear regulator 121, a switching regulator 122, a current sensor 123, a comparator 124, and a selector 125, and may provide a first power supply PA1 to the first power amplifier PA1. The modulation circuit 120a will be described with reference to FIGS. 5A and 5B.

The linear regulator 121 may receive the first output voltage VO1 provided from the SIMO modulator 110a as a power supply voltage and amplify and output the first envelope signal ENV1. For example, the linear regulator 121 may be implemented as a linear amplifier. Referring to FIG. 5B, the linear regulator 121 may be implemented as a differential amplifier and receive a positive signal ENV1p and a negative signal ENV1n of the first envelope signal ENV1 through a positive terminal (+) and a negative terminal (−), respectively. And can receive the negative signal ENV1n, respectively. The output of the linear regulator 121 may be fed back and applied to the negative terminal (−) of the linear regulator 121.

The switching regulator 122 may include, for example, a buck converter, a booster converter, a buck-booster converter, a Cuk converter, or any one of other DC-DC converters.

The switching regulator 122 may operate in conjunction with the linear regulator 121 (e.g., the ET mode), and in this case, an output current may be increased or decreased by controlling the states of switches (e.g., switches S4 and S5 in FIG. 5B) of the switching regulator 122 based on an output signal of the comparator 124. As a result, the switching regulator 122 may supply an average current to the first power amplifier 401.

The switching regulator 122 may also regulate an input voltage to a target level during independent operation (e.g., the APT mode) and output a regulated power supply voltage.

Referring to FIG. 5B, the switching regulator 122 may include a switch controller SCNT, switches S4 and S5, an inductor L2, and a capacitor Cs. The switches S4 and S5, the inductor L2 and the capacitor Cs may constitute a buck converter, as shown in FIG. 5B. However, example embodiments are not limited thereto, and the switches S4 and S5, the inductor L2 and the capacitor Cs may constitute other DC-DC converters.

The switch controller SCNT may control the states of the switches S4 and S5. The switches S4 and S5 may be turned on or off based on control signals output from the switch controller SCNT. The first switch controller SCNT may generate control signals based on output signals of the comparator 124 in the ET mode and generate control signals based on the first reference voltage $V_{REF1}$ in the APT mode.

The current sensor 123 may sense an output current of the linear regulator 121 and output the level of the sensed output current as the detection voltage. For example, the current sensor 123 may detect a positive voltage when the direction of the output current of the linear regulator 121 is an output direction (that is, when current is output from the linear regulator 121), and the output of the linear regulator 121, and may detect a negative voltage when the direction of the output current of the linear regulator 121 is an input direction (that is, when current is applied to the linear regulator 121). For example, the current sensor 123 may include a resistive element.

The comparator 124 may output a signal for controlling the operation of the switching regulator 122 based on a detection voltage supplied from the current sensor 123. For example, as shown in FIG. 5B, the comparator 124 may compare detection voltages output from the current sensor 123, that is, voltages of both ends of the current sensor 123, and output the comparison result. As described above, in the ET mode, the switching regulator 122 may operate in accordance with the output signal of the comparator 124.

The selector 125 may select a signal for controlling the operation of the switching regulator 122, based on the mode signal MD. For example, the selector 125 may provide the output signal of the comparator 124 to the switching regulator 122 when the mode signal MD indicates the ET mode, and may provide the first reference voltage $V_{REF1}$ to the switching regulator 122 when the mode signal MD indicates the APT mode.

In this manner, the modulation circuit 120a generates a modulation voltage according to the ET or APT and provides the modulation voltage to the first power amplifier 401. The operation of the supply modulator 100a according to operation modes, that is, the ET mode and the APT mode, will be described in detail with reference to FIGS. 6A to 6C.

Figure 6A:
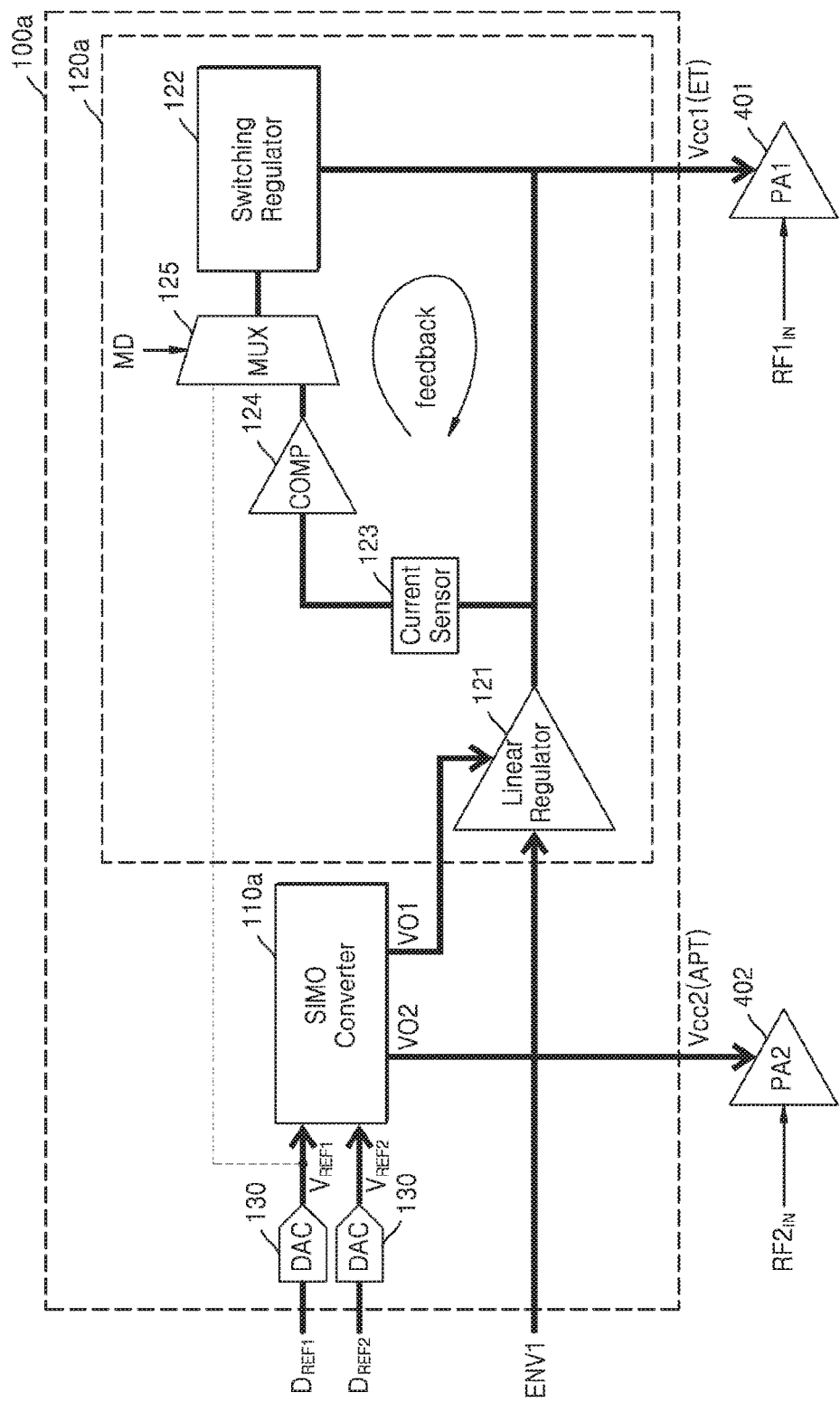
FIG. 6A shows the operation of a supply modulator when a power supply voltage according to Envelope Tracking (ET) is provided to a power amplifier.

FIG. 6A shows the operation of a supply modulator when a power supply voltage according to the ET is provided to a power amplifier. Specifically, FIG. 6A shows the operation of the supply modulator 100a of FIG. 5A when the supply modulator 100a provides a power supply voltage according to the ET to the first power amplifier 401. Descriptions of the SIMO converter 110a and the DACs 130 which operate independently of the operation modes will be omitted.

Referring to FIG. 6A, when the modulation circuit 120a operates in the ET mode, the linear regulator 121, the switching regulator 122, the current sensor 123, and the comparator 124 may operate to generate a modulation voltage Vcc1 and the generated modulation voltage Vcc1 may be provided to the first power amplifier PA1. The current sensor 123 and the comparator 124 may perform a feedback operation on the output of the linear regulator 121 so that the switching regulator 122 operates based on the output of the linear regulator 121.

The switching regulator 122 has a high current efficiency, and the linear regulator 121 has a relatively low current efficiency and a high operating speed. Therefore, when the modulation circuit 120a operates in the ET mode, the switching regulator 122 may provide an average current to a load, e.g., the first power amplifier PA1, and the linear regulator 121 may supply the remaining current to the first power amplifier PA1. In other words, the switching regulator 122 tracks a low frequency region of the envelope signal ENV to provide an output voltage in a wide range, and the linear regulator 121 tracks a high frequency region of the first envelope signal ENV1 and ensures a high output accuracy with respect to the power supply voltage of the first power amplifier 401. As shown in FIG. 5B, the capacitor Cs of the switching regulator 122 may be connected to the output of the linear regulator 121. As described above, in order for the output of the linear regulator 121 to change quickly, the capacitance of the capacitor Cs has to be small.

Figure 6B:
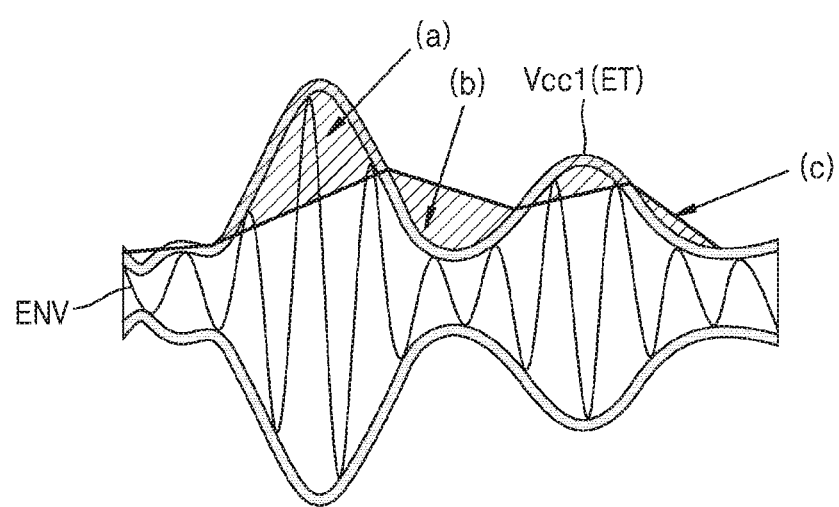
FIG. 6B shows a method in which a modulation circuit supplies a power supply voltage according to the ET.

FIG. 6B shows a method in which the modulation circuit 120a supplies a power supply voltage according to the ET.

As shown in FIG. 6B, the switching regulator 122 may supply an average current (c), and the linear regulator 121 may supply an additional current (a) to the first power amplifier 401 when the output current of the switching regulator 122 is less than a current required by the first power amplifier 401, and may absorb a surplus current (b) when the output current of the switching regulator 122 is greater than a current required by the first power amplifier 40.

Figure 6C:
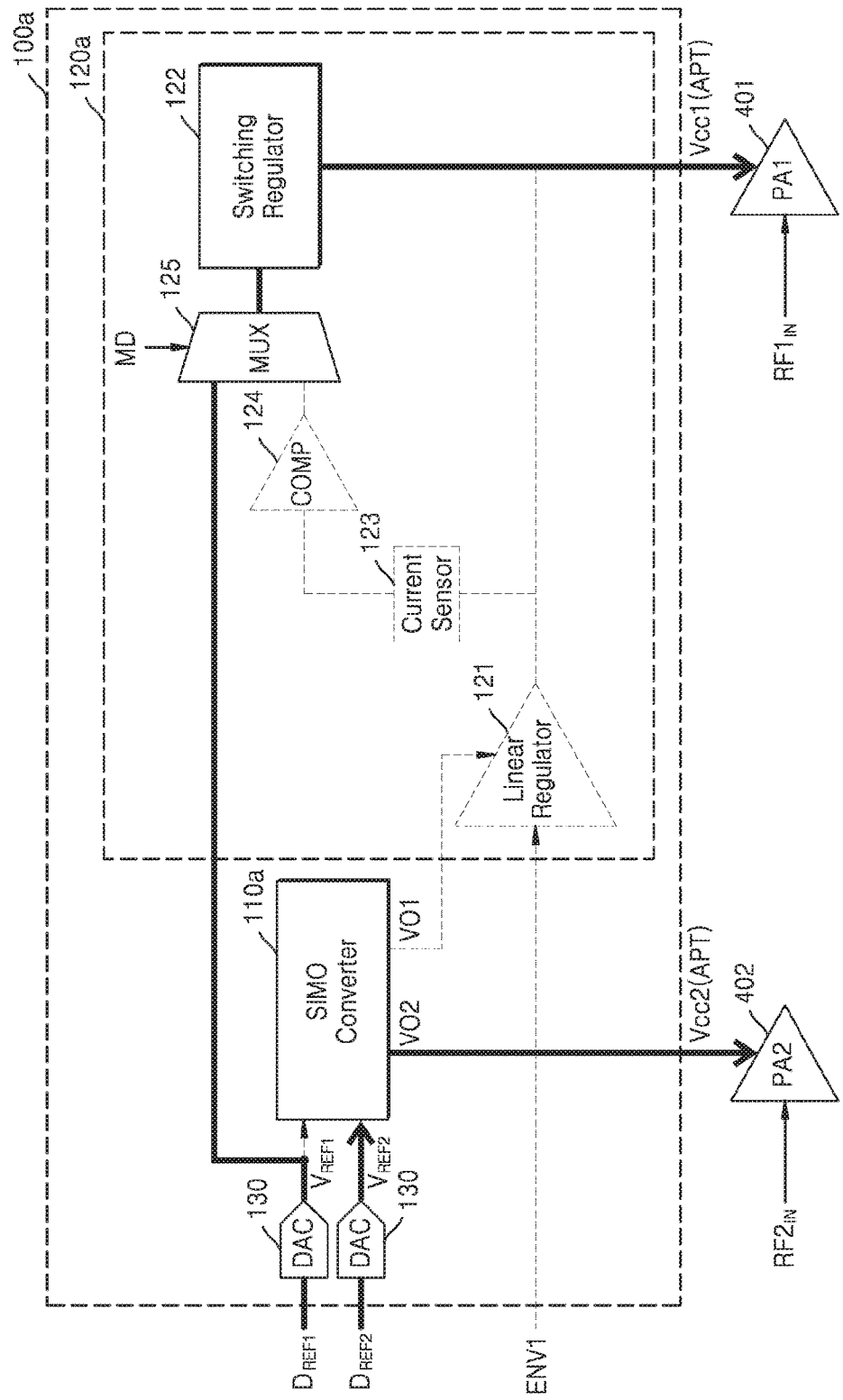
FIG. 6C shows the operation of a supply modulator when a power supply voltage according to Average Power Tracking (APT) is provided to a power amplifier.

FIG. 6C shows the operation of a supply modulator when a power supply voltage according to the APT is provided to a power amplifier. Specifically, FIG. 6C shows the operation of the supply modulator 100a of FIG. 5A when the supply modulator 100a provides a power supply voltage according to the APT to the first power amplifier 401.

Referring to FIG. 6C, when the modulation circuit 120a operates in an APT mode, the linear regulator 121 may be turned off. Accordingly, the operations of the current detector 123 and the comparator 124 may be stopped. In this case, the selector 125 may provide the first reference voltage $V_{REF1}$ to the switching regulator 122, and the switching regulator 122 may generate a modulation voltage Vcc1 according to the APT based on the first reference voltage $V_{REF1}$. The switching regulator 122 may regulate an input voltage VDD in FIG. 5B to a target level, for example, the level of the first reference voltage VREF1, and may output a regulated power supply voltage, that is, the modulation voltage Vcc1 according to the APT, to the power amplifier 401.

Figure 7:
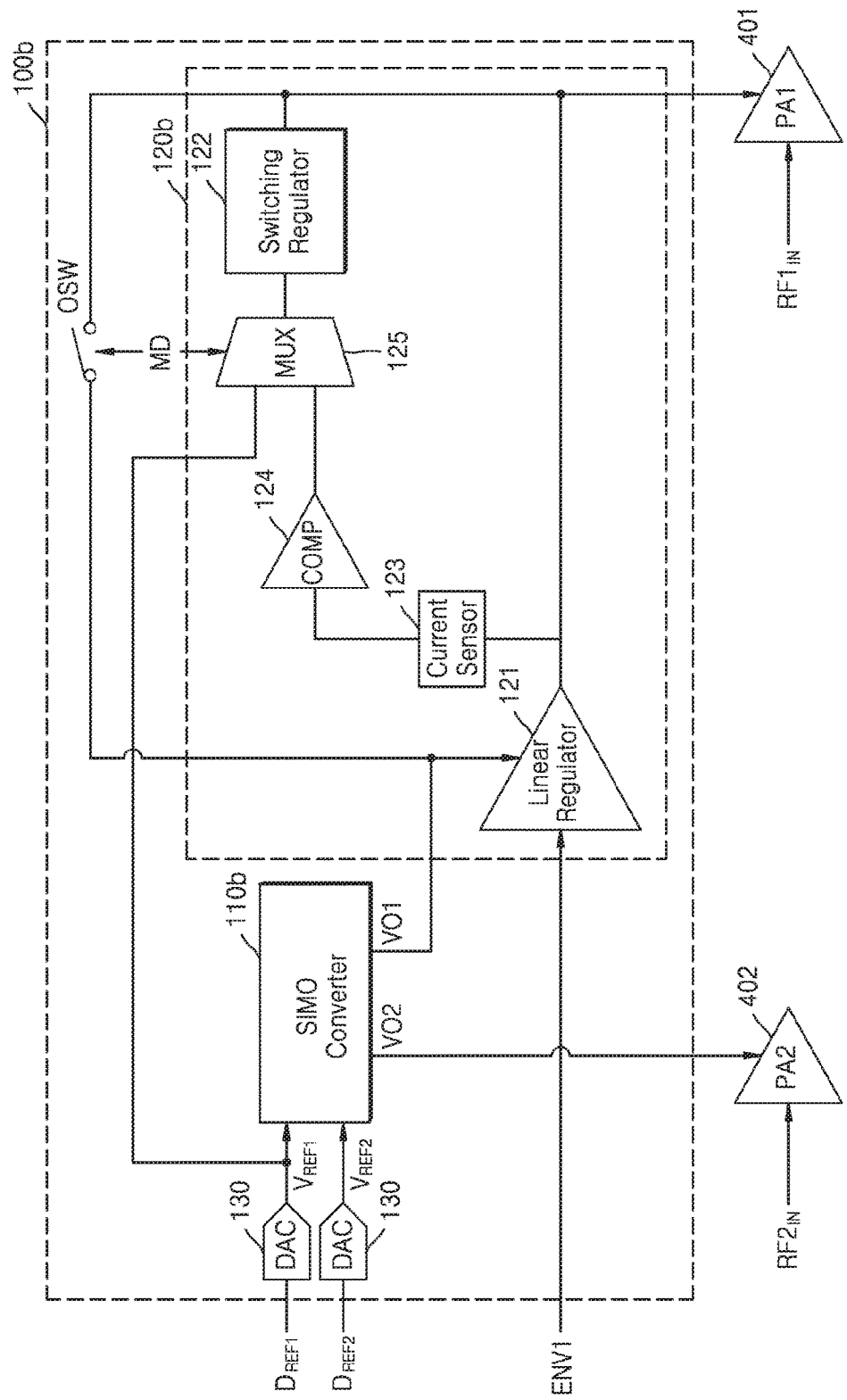
FIG. 7 is a block diagram illustrating an example of a supply modulator according to an example embodiment.

FIG. 7 is a block diagram illustrating an example of a supply modulator 100b according to an example embodiment. For convenience of explanation, first and second power amplifiers 401 and 402 are also shown.

Referring to FIG. 7, the supply modulator 100b may include an SIMO converter 110b and a modulation circuit 120b. The supply modulator 100b may also include a plurality of DACs 130. The operation and configuration of the supply modulator 100b of FIG. 7 are similar to those of the supply modulator 100a of FIG. 5A. Therefore, a difference between the supply modulator 100b and the supply modulator 100a will be mainly described.

The configuration and operation of the SIMO converter 110b are similar to those of the SIMO converter 110 of FIG. 4A, and the configuration and operation of the modulation circuit 120b are similar to those of the modulation circuit 120a of FIGS. 5A and 5B.

The SIMO converter 110b according to the present example embodiment may provide a first output voltage VO1 as a power supply voltage to a linear regulator 121 of the modulation circuit 120b, or to the first power amplifier 401. To this end, the supply modulator 100b may include an output switch OSW that operates in accordance with a mode signal MD.

For example, when the supply modulator 100b provides a power supply voltage according to the ET to the first power amplifier 401 (e.g., an ET mode), the output switch OSW may be turned off in response to a mode signal MD indicating the ET mode. The first output voltage VO1 may be provided to the linear regulator 121. When the supply modulator 100b provides a power supply voltage according to the APT to the first power amplifier 401 (e.g., an APT mode), the output switch OSW may turned on in response to a mode signal MD indicating the APT mode. The first output voltage VO1 may be provided to the first power amplifier 401. As another example, in the APT mode, the switching regulator 122 may supply a power supply voltage to the first power amplifier 401. In this case, the output switch OSW may be turned on in response to the mode signal MD, and the switching regulator 122 may stably supply a power supply voltage by using a capacitor provided in the SIMO converter 110b, for example, the first capacitor C1 in FIG. 4A.

Hereinafter, operations of the supply modulator 100b of FIG. 7 will be described in more detail with reference to FIGS. 8A to 8C.

Figure 8A:
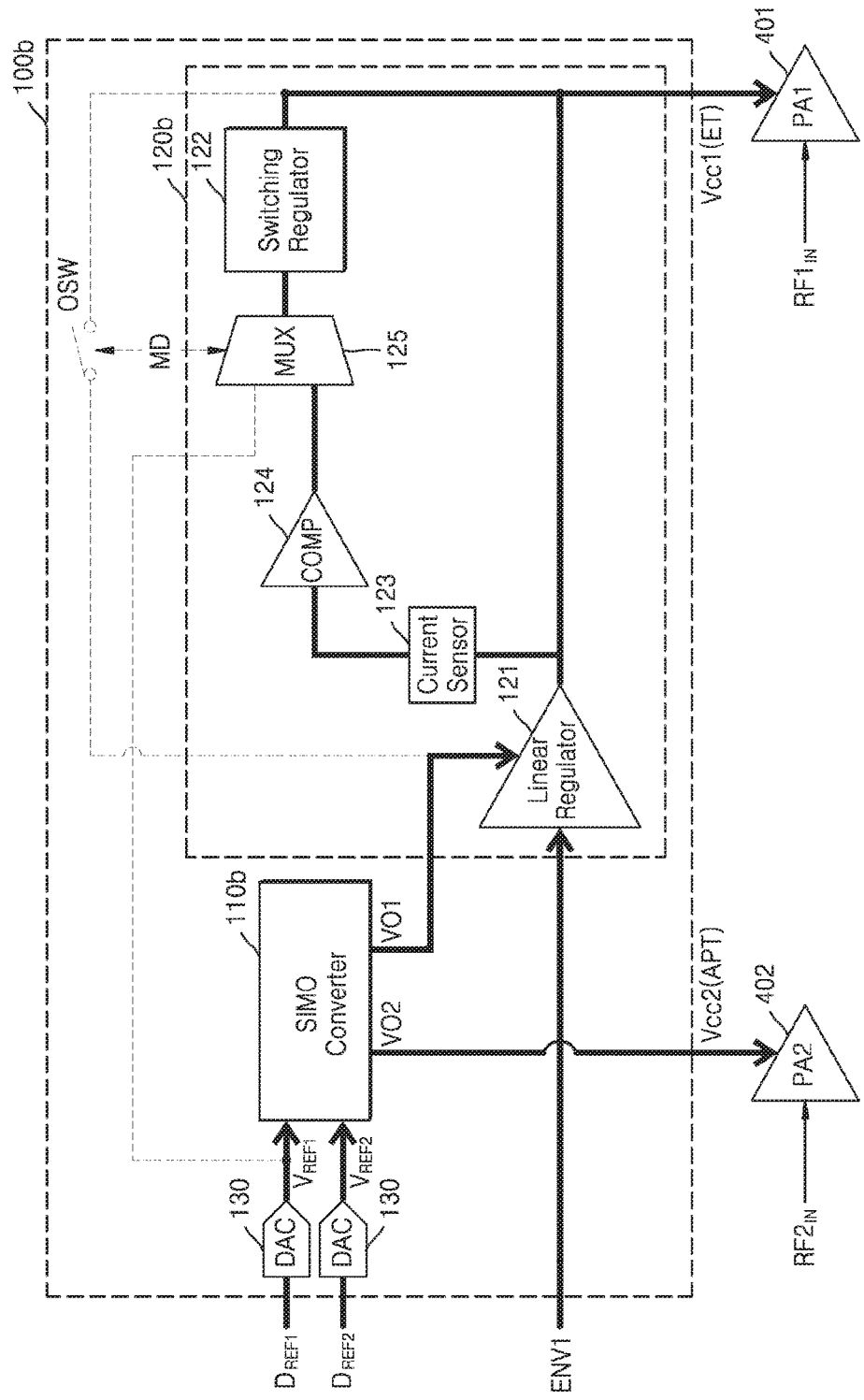
FIG. 8A shows an example of a supply modulator operation when a power supply voltage according to the ET is provided to a power amplifier.

FIG. 8A shows an example of a supply modulator operation when a power supply voltage according to the ET is provided to a power amplifier. Specifically, FIG. 8A shows the operation of the supply modulator 100b of FIG. 7 when the supply modulator 100b provides a power supply voltage according to the ET to the first power amplifier 401.

Referring to FIG. 8A, when a power supply voltage according to the ET is provided to the first power amplifier 401, the output switch OSW may be turned off according to a mode signal MD indicating an ET mode. The SIMO converter 110b may provide the first output voltage VO1 as a power supply voltage to the linear regulator 121 of the modulation circuit 120b, and the modulation circuit 120b including the linear regulator 121 may operate based on the first envelope signal ENV1, generate a modulation voltage according to the ET, and provide the modulation voltage to the first power amplifier 401 as a power supply voltage Vcc1 (ET).

FIG. 8B shows an example of a supply modulator operation when a power supply voltage according to the APT is provided to a power amplifier. Specifically, FIG. 8B shows the operation of the supply modulator 100b of FIG. 7 when the supply modulator 100b of FIG. 7 provides a power supply voltage according to the APT to the first power amplifier 401 and current supplied to the first power amplifier 401 is small (e.g., a light load condition).

Referring to FIG. 8B, when a power supply voltage according to the APT is provided to the first power amplifier PA1, the output switch OSW may be turned on according to a mode signal MD indicating an APT mode. Accordingly, the SIMO converter 110b may provide the first output voltage VO1 directly to the first power amplifier 401 as a power supply voltage Vcc1 (APT). In this case, the operation of the modulation circuit 120b may be stopped.

Figure 8C:
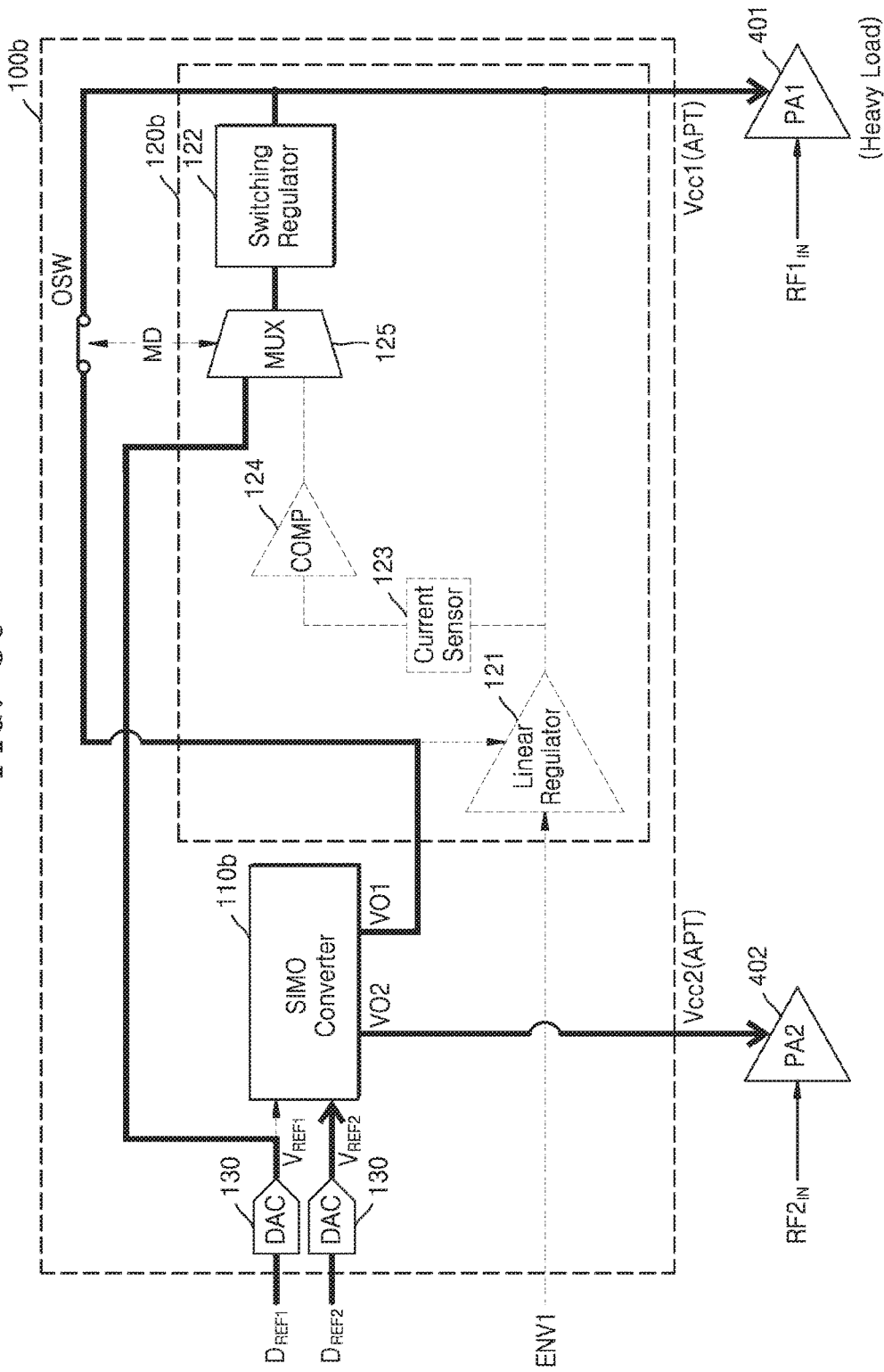
FIG. 8C shows another example of a supply modulator operation when a power supply voltage according to the APT is provided to a power amplifier.

FIG. 8C shows another example of a supply modulator operation when a power supply voltage according to the APT is provided to a power amplifier. Specifically, FIG. 8C shows the operation of the supply modulator 100b of FIG. 7 when the supply modulator 100b of FIG. 7 provides a power supply voltage according to the APT to the first power amplifier 401 and current supplied to the first power amplifier 401 is large (e.g., a heavy load condition).

As described above with reference to FIG. 6A, the switching regulator 122 has a high current efficiency. Therefore, when current consumed in the first power amplifier 401 is large, the switching regulator 122 having a high current efficiency may provide the power supply voltage Vcc1 (APT) according to the APT.

A capacitor (e.g., the capacitor Cs in FIG. 5B) provided in the switching regulator 122 may have a relatively small capacitance, and a capacitor provided in the SIMO converter 110b, for example, the first capacitor C1 in FIG. 4A, may have a relatively large capacitance. Therefore, in order to supply the power supply voltage Vcc1 (APT) having a stable level to the first power amplifier 401, the capacitor provided in the SIMO converter 110b, for example, the first capacitor C1 in FIG. 4A, may be used.

The output switch OSW may be turned on in response to the mode signal MD, and the first capacitor C1 provided in the SIMO converter 110b may be connected to the output of the switching regulator 122. The first capacitor C1 may stably maintain the level of the output voltage of the switching regulator 122. In this case, the SIMO converter 110b may not generate the first output voltage VO1, but may generate only the second output voltage VO2. Therefore, the first output switch SW1 in FIG. 4A, connected to the first capacitor C1, may maintain a turn-off state.

Figure 9:
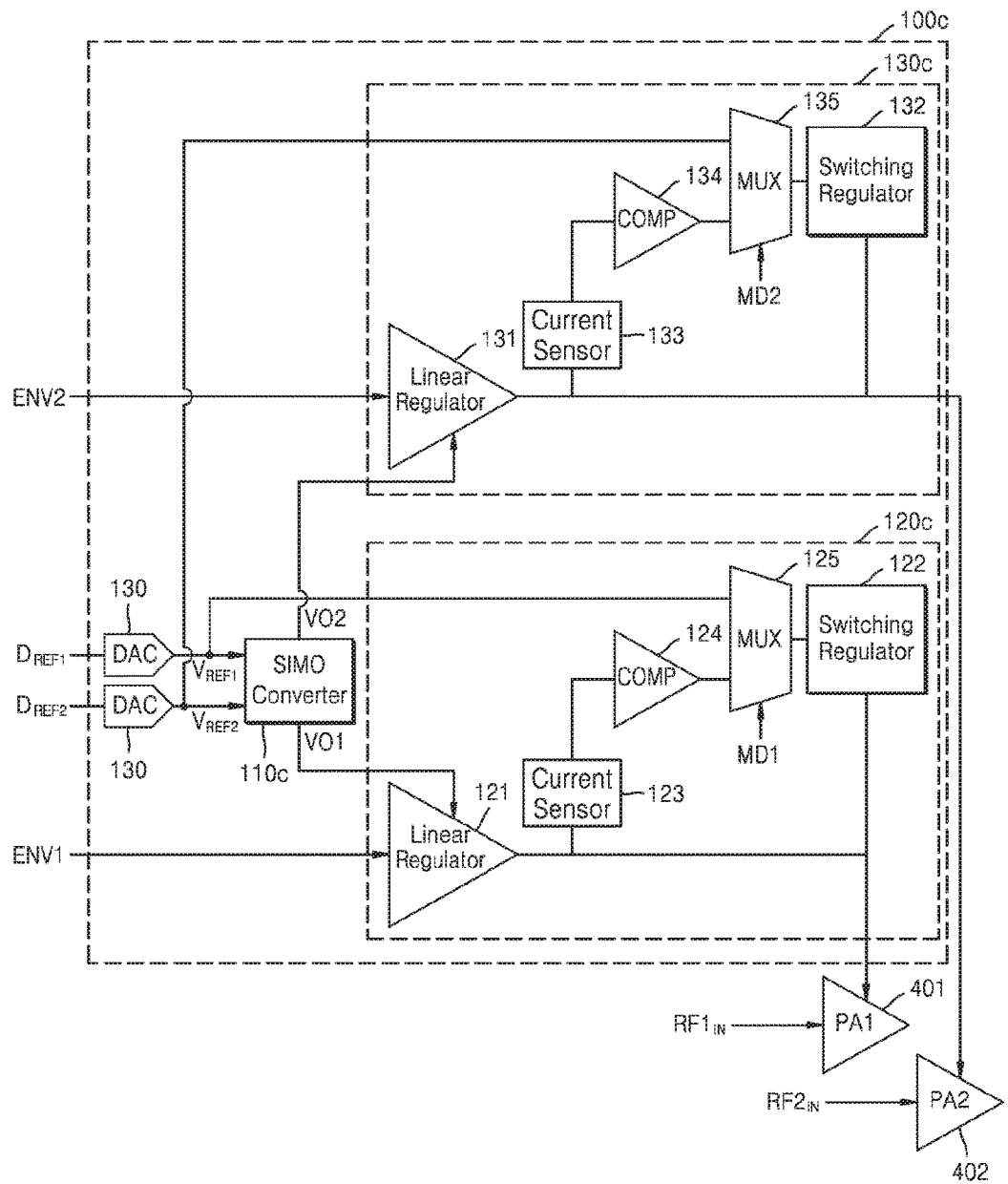
FIG. 9 is a block diagram illustrating an example of a supply modulator according to an example embodiment.

FIG. 9 is a block diagram illustrating an example of a supply modulator 100c according to an example embodiment. For convenience of explanation, first and second power amplifiers 401 and 402 are also shown.

FIG. 9 shows a supply modulator structure that provides a power supply voltage according to the ET or APT to a plurality of power amplifiers, e.g., the first power amplifier 401 and the second power amplifier 402.

Referring to FIG. 9, the supply modulator 100c may include an SIMO converter 110c, a plurality of DACs 130, a first modulation circuit 120c, and a second modulation circuit 130c.

The supply modulator 100c may receive a first envelope signal ENV1, a first average power signal $D_{REF1}$ and a second average power signal $D_{REF2}$ from the modem 200 of FIG. 1. The first average power signal $D_{REF1}$ and the second average power signal $D_{REF2}$ may be respectively converted into a first reference voltage $V_{REF1}$ and a second reference voltage $V_{REF2}$ via the DACs 130. The SIMO converter 110c may generate a first output voltage VO1 and a second output voltage VO2 based on the first reference voltage $V_{REF1}$ and the second reference voltage $V_{REF2}$, provide the first output voltage VO1 as a power supply voltage of a linear regulator 121 of the first modulation circuit 120c, and provide the second output voltage VO2 as a power supply voltage of a linear regulator 131 of the second modulation circuit 120c. When the first modulation circuit 120c (or the second modulation circuit 130c) generates a modulation voltage according to the ET, the sum of an output of the linear regulator 121 of the first modulation circuit 120c (or the linear regulator 131 of the second modulation circuit 130c) and an output of a switching regulator 122 (or an output of a switching regulator 132) may be generated as a modulation voltage according to the ET. When the first modulation circuit 120c (or the second modulation circuit 130c) generates a modulation voltage according to the APT, the linear regulator 121 of the first modulation circuit 120c (or the linear regulator 131 of the second modulation circuit 130c) may be turned off and an output of the switching regulator 122 (or the switching regulator 132) may be generated as a modulation voltage according to the APT. In this case, when both the first modulation circuit 120c and the second modulation circuit 130c generate modulation voltages according to the APT, the linear regulators 121 and 131 provided in the first and second modulation circuits 120c and 130c, respectively, do not operate, and thus, the SIMO converter 110c may be turned off.

The structures and operations of the first and second modulation circuits 120c and 130c are similar to those of the modulation circuit 120a described with reference to FIG. 5A. Therefore, further detailed description will be omitted.

A first mode signal MD1 and a second mode signal MD2, which indicate an ET mode or an APT mode may be determined based on the levels of output signals of the first power amplifier 401 and the second power amplifier 402, respectively. For example, the first mode signal MD1 and the second mode signal MD2 may be determined in consideration of the power efficiencies of the first power amplifier 401, the second power amplifier 402, and the supply modulator 100c. Accordingly, the first mode signal MD1 and the second mode signal MD2 may be the same or different from each other. In other words, a power supply voltage according to the ET or a power supply voltage according to the APT may be provided to both the first power amplifier 401 and the second power amplifier 402. A power supply voltage according to the ET may be provided to the first power amplifier 401 and a power supply voltage according to the APT may be provided to the second power amplifier 402. Also, a power supply voltage according to the APT may be provided to the first power amplifier 401 and a power supply voltage according to the ET may be provided to the second power amplifier 402.

In another example embodiment, as described with reference to FIGS. 7 and 8B, when a power supply voltage according to the APT is provided to the first power amplifier 401 or the second power amplifier 402, the first output voltage VO1 or the second output voltage VO2 of the SIMO converter 110c may be provided as a power supply voltage according to the APT. To this end, the supply modulator 100c may further include output switches to provide the first output voltage VO1 and the second output voltage VO2 of the SIMO converter 110c to the first power amplifier 401 and the second power amplifier 402 in response to the first mode signal MD1 and the second mode signal MD2, respectively.

Figure 10:
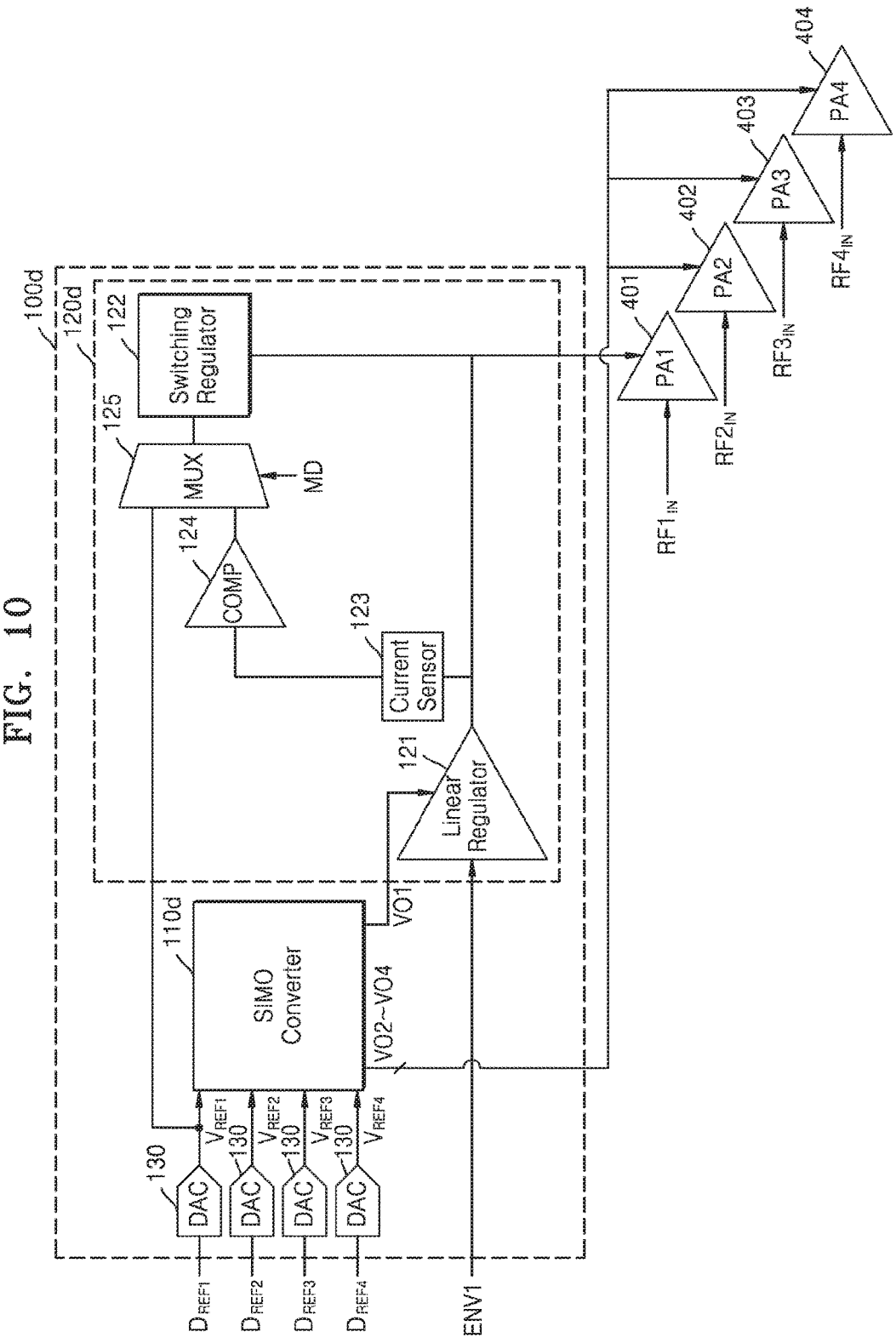
FIG. 10 is a block diagram illustrating an example of a supply modulator according to an example embodiment.

FIG. 10 is a block diagram illustrating an example of a supply modulator 100d according to an example embodiment. For convenience of explanation, first to fourth power amplifiers 401 to 404 are also shown.

FIG. 10 shows a supply modulator structure that provides a power supply voltage according to the ET or APT to one power amplifier, e.g., the first power amplifier 401, and provides a power supply voltage according to the APT to a plurality of other power amplifiers, e.g., the second to fourth power amplifiers 402 to 404. In the present example embodiment, although a power supply voltage according to the APT is provided to three power amplifiers, example embodiments are not limited thereto. For example, a power supply voltage according to the APT may be provided to two power amplifiers or four or more power amplifiers.

The SIMO converter 110d may generate first to fourth output voltages VO1 to VO4 based on first to fourth reference voltages $V_{REF1}$ to $V_{REF4}$, provide the first output voltage VO1 as a power supply voltage to a linear regulator 121 of a modulation circuit 120d, and provide the second to fourth output voltages VO2 to VO4 as power supply voltages to the second to fourth power amplifiers 402 to 404, respectively. Accordingly, the supply modulator 100d may provide power supply voltages modulated based on an amplitude component of a transmission signal to a plurality of power amplifiers (e.g., the first to fourth power amplifiers 401 to 404) by using the SIMO converter 110*d*. The configuration and operation of the supply modulator 100*d* are similar to those of the supply modulator 100*a* of FIG. 5, and repeated descriptions thereof will be omitted.

Figure 11:
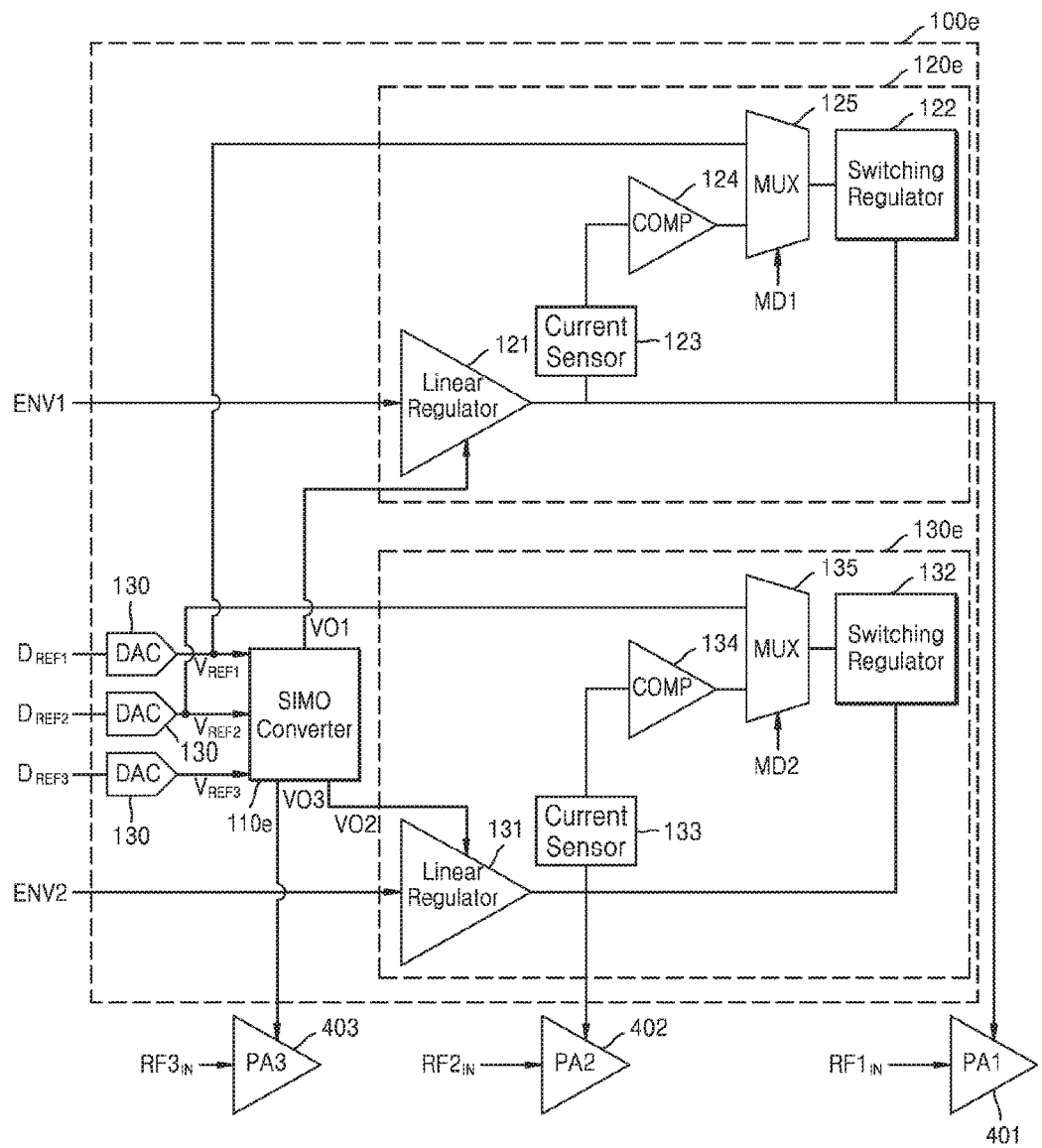
FIG. 11 is a block diagram illustrating an example of a supply modulator according to an example embodiment.

FIG. 11 is a block diagram illustrating an example of a supply modulator 100*e* according to an example embodiment. For convenience of explanation, first to third power amplifiers 401 to 403 are also shown.

FIG. 11 shows a supply modulator structure that provides a power supply voltage according to the ET or APT to a plurality of power amplifiers, e.g., the first and second power amplifiers 401 and 402, and provides a power supply voltage according to the APT to at least one another power amplifier, e.g., the third power amplifier 403.

Referring to FIG. 11, the supply modulator 100*e* may include a plurality of DACs 130, an SIMO converter 110*e*, a first modulation circuit 120*e*, and a second modulation circuit 130*e*. The SIMO converter 110*e* may generate first to third output voltages VO1 to VO3 based on first to third reference voltages $V_{REF1}$ to $V_{REF3}$ output from the plurality of DACs 130, respectively. The first to third output voltages VO1 to VO3 may be modulation voltages according to the APT. The SIMO converter 110*e* may provide the first output voltage VO1 as a power supply voltage to a linear regulator 121 of the first modulation circuit 120*e*, provide the second output voltage VO2 as a power supply voltage to a linear regulator 131 of the second modulation circuit 130*e*, and provide the third output voltage VO3 as a power supply voltage to the third power amplifier 403. The first modulation circuit 120*e* may generate a modulation voltage according to the ET or APT and provide the generated modulation voltage as a power supply voltage to the first power amplifier 401. The second modulation circuit 130*e* may also generate a modulation voltage according to the ET or APT and provide the generated modulation voltage as a power supply voltage to the second power amplifier 402. Accordingly, a power supply voltage according to the ET or APT may be provided to a plurality of power amplifiers, e.g., the first and second power amplifiers 401 and 402, and a power supply voltage according to the APT may be provided to at least one another power amplifier, e.g., the third power amplifier 403. The configurations and operations of the first and second modulation circuits 120*e* and 130*e* are similar to those of the first and second modulation circuits 120*c* and 130*c* of FIG. 9. Descriptions provided with reference to FIG. 9 may be applied to the example embodiment of FIG. 11.

The structures and operations of the supply modulators according to various example embodiments have been described above with reference to FIGS. 5 to 11. Based on the above description, the structures and operations of the supply modulators may be variously changed.

Figure 12:
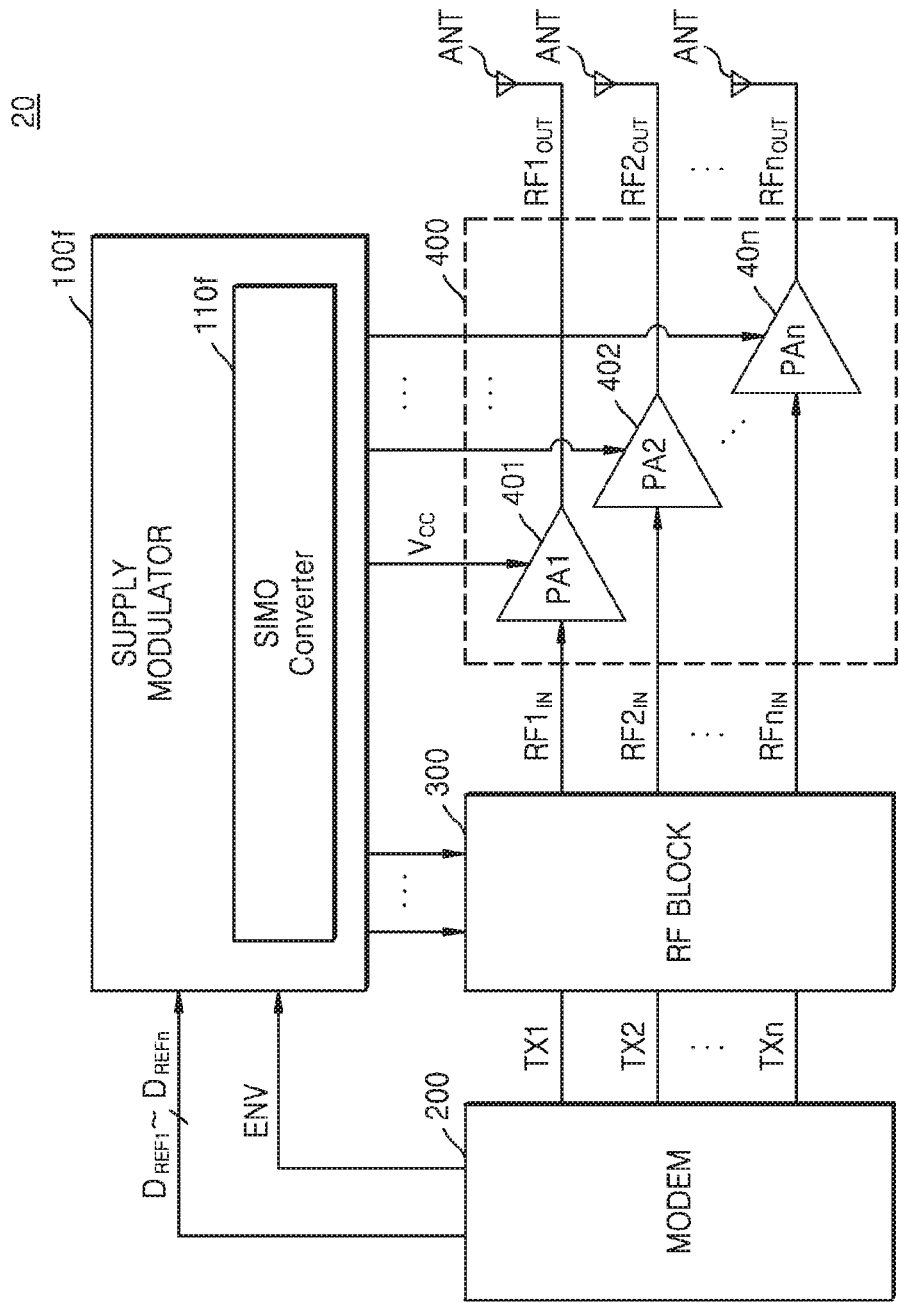
FIG. 12 is a block diagram of a transmitting device according to an example embodiment.

FIG. 12 is a block diagram of a transmitting device 20 according to an example embodiment.

Referring to FIG. 12, the transmitting device 20 may include a modem 200, a supply modulator 100*f*, an RF block 300, and a power amplifying unit 400. The power amplifying unit 400 may include a plurality of power amplifiers 401 to 40*n* corresponding to a plurality of carriers.

The operation of the transmitting device 20 of FIG. 12 is similar to that of the transmitting device 10 of FIG. 1. However, in the present example embodiment, the supply modulator 100*f* may provide the RF block 300 with a plurality of modulation voltages. In this manner, the supply modulator 100*f* may generate and supply various kinds of modulated voltages as well as modulation voltages, i.e., power supply voltages, provided to the plurality of power amplifiers 401 to 40*n* by using an SIMO converter 110*f*.

Figure 13:
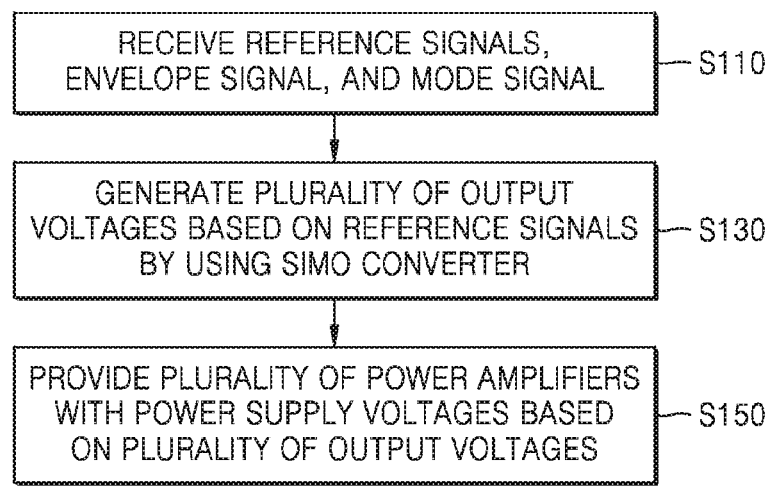
FIG. 13 is a flowchart illustrating an operation method of a supply modulator according to an example embodiment.

FIG. 13 is a flowchart illustrating an operation method of a supply modulator according to an example embodiment. The operation method of FIG. 13 may be performed in the supply modulators 100, 100*a*, 100*b*, 100*c*, 100*d*, 100*e*, and 100*f* described with reference to FIGS. 1 to 12, and descriptions provided above with reference to FIGS. 1 to 12 may be applied to the present example embodiment.

Referring to FIG. 13, in operation S110, the supply modulator may receive reference signals, an envelope signal, and a mode signal. The reference signals, the envelope signal, and the mode signal may be provided from a modem. The reference signals are generated based on an amplitude component of each of a plurality of transmission signals applied to a plurality of power amplifiers. In an example embodiment, as described above with reference to FIG. 1, the supply modulator may receive average power signals, which are digital signals, from the modem, as the reference signals. The supply modulator may convert average power signals, which are digital signals, into analog signals by using a DAC converter.

In operation S130, an SIMO converter included in the supply modulator may generate a plurality of output voltages based on the reference signals. For example, when the supply modulator provides modulated power to n power amplifiers (n is an integer of two or more), the SIMO converter may generate n output voltages.

In operation S150, the supply modulator may provide a plurality of power amplifiers with power supply voltages based on a plurality of output voltages. In an example embodiment, the supply modulator may include at least one modulation circuit having a hybrid structure, at least one of the plurality of output voltages may be provided as a power supply voltage to a linear regulator of at least one modulation circuit, and the at least one modulation circuit may generate a modulation voltage according to the ET or APT and provide the generated modulation voltage as a power supply voltage to at least one power amplifier. The supply modulator may also provide the remaining output voltages as power supply voltages to the other power amplifiers. Thus, the supply modulator may provide the plurality of power amplifiers with a power supply voltage whose level varies based on the amplitude of a transmission signal, based on the plurality of output voltages generated from the SIMO converter.

Figure 14:
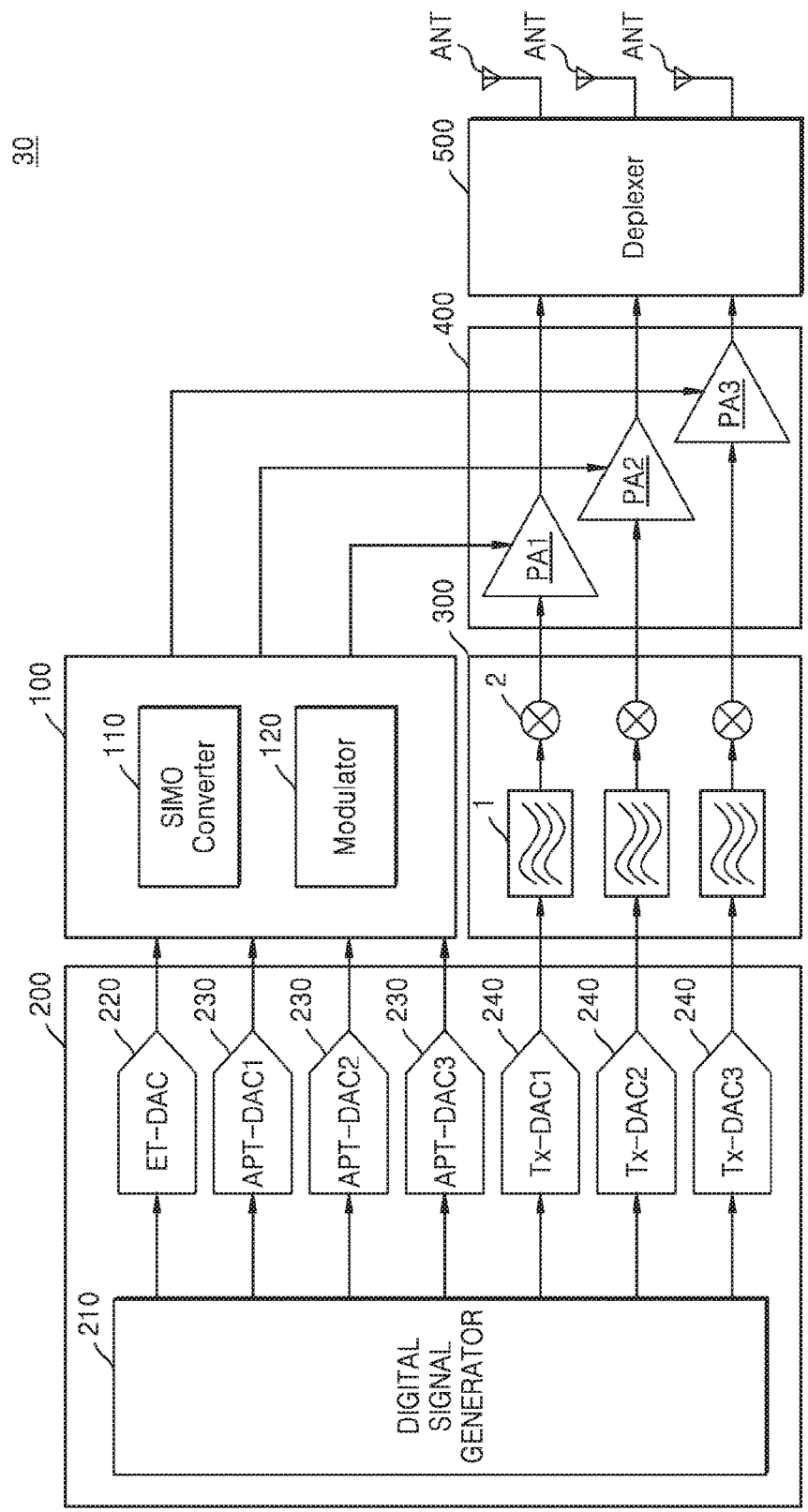
FIG. 14 is a block diagram of a communication device according to an example embodiment.

FIG. 14 is a block diagram of a communication device 30 according to an example embodiment.

Referring to FIG. 14, the communication device 30 may include a modem 200, a supply modulator 100, an RF block 300, a power amplifying unit 400, and a duplexer 500.

The modem 200, the supply modulator 100, the RF block 300, the power amplifying unit 400, and the duplexer 500 may be respectively implemented as integrated circuits (ICs), chips, or modules. In addition, the modem 200, the supply modulator 100, the RF block 300, the power amplifying unit 400, and the duplexer 500 may be mounted together on a printed circuit board (PCB). However, example embodiments are not limited thereto, and in some example embodiments, at least some of the modem 200, the supply modulator 100, the RF block 300, the power amplifier section 400, and the duplexer 500 may be implemented as a single communication chip.

The modem 200 may include a digital signal generator 210 and first to third DACs 220, 230 and 240. Although not shown, the modem 200 may further include digital gain blocks for adjusting the gains of signals output from the digital signal generator 210.

The digital signal generator 210 may generate a digital signal (for example, an I signal or a Q signal) including information to be transmitted, and output a digital transmission signal, a digital envelope signal and a digital average power signal from the generated digital signal. The digital transmission signal may be substantially the same as the digital signal, and the digital envelope signal may be generated from an amplitude component of the digital signal.

The first DAC 220 may convert the digital envelope signal to an analog envelope signal.

A plurality of second DACs 230 may convert digital average power signals into analog average power signals. The analog average power signals may be provided as reference voltages to the supply modulator 100.

A plurality of third DACs 240 may convert digital transmission signals into analog transmission signals.

The first DAC 220 converts a rapidly varying envelope signal from a digital signal to an analog signal, each of the third DACs 240 converts a rapidly varying transmission signal from a digital signal to an analog signal, and each of the second DACs 230 converts a slowly varying average power signal from a digital signal to an analog signal. Therefore, the first DAC 220 and the third DACs 240 may operate at a higher speed than the second DACs 220.

In the present example embodiment, although the plurality of second DACs 230 for converting digital average power signals into analog average power signals are provided in the modem 200, example embodiments are not limited thereto. The plurality of second DACs 230 may be provided in the supply modulator 100. Accordingly, as described in the above example embodiments, the modem 200 may provide digital average power signals to the supply modulator 100, and the supply modulator 100 may convert the digital average power signals into analog average power signals, i.e., reference signals.

The RF block 300 may include a plurality of low-pass filters 1 and a mixer 2. The low pass filters 1 may perform low pass filtering on analog transmission signals output from the third DACs 240. The mixer 2 may upconvert the frequency of an output of the low-pass filter 1 and generate an RF input signal. A plurality of analog transmission signals may be converted into a plurality of RF input signals through the RF block 300.

The supply modulator 100 may include an SIMO converter 110 and at least one modulation circuit 120 having a hybrid structure. Any one of the supply modulators according to various example embodiments described with reference to FIGS. 1 to 11 and 13 may be employed as the supply modulator 100 of the present example embodiment. The supply modulator 100 may provide a power supply voltage to a plurality of power amplifiers provided in the power amplifying unit 400 based on a plurality of output voltages output from the SIMO converter 110. Some of the plurality of output voltages may be provided as power supply voltages to some power amplifiers, and some other output voltages of the plurality of output voltages may be provided as power supply voltages of the modulation circuit 120, and thus, the modulation circuit 120 may generate a modulation voltage and provide the generated modulation voltage as a power supply voltage to another power amplifier.

The power amplifying unit 400 may include a plurality of power amplifiers, for example, first to third power amplifiers PA1, PA2, and PA3. The plurality of power amplifiers may amplify power of the RF input signals based on applied power supply voltages, generate RF output signals, and output the generated RF output signals.

The duplexer 500 may be connected to an antenna ANT to separate a transmission frequency from a reception frequency. The duplexer 500 may separate RF output signals, provided from the power amplifying unit 400, according to frequency bands and provide the separated RF output signals to an antenna. For example, a front end module with an integrated duplexer (FEMiD) may be applied as the duplexer 500.

Figure 15:
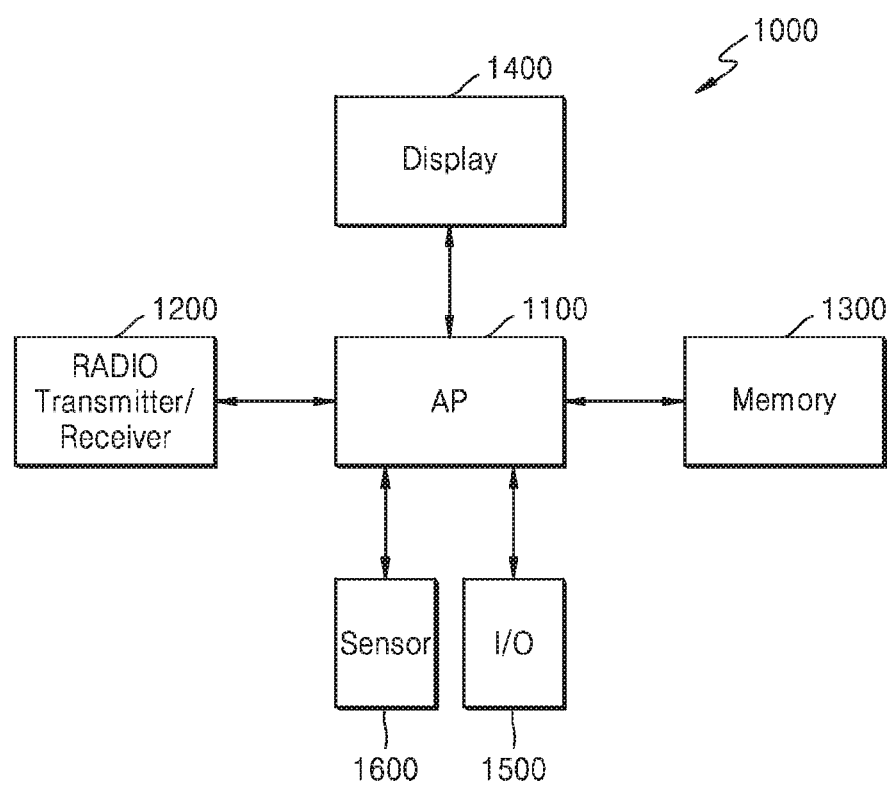
FIG. 15 is a block diagram of an Internet Of Things (IoT) device according to an example embodiment.

FIG. 15 is a block diagram of an Internet Of Things (IoT) device 1000 according to an example embodiment.

Referring to FIG. 15, the IoT device 1000 according to the present example embodiment may include a DAC according to an example embodiment. IoT may denote a network between objects which uses wired/wireless communication. The IoT device 1000 may have an accessible wired or wireless interface and may include devices that communicate with one or more other devices via the wired or wireless interface to transmit or receive data. The accessible wired or wireless interface may include a modem communication interface that is connectible to a wired local area network (LAN), a wireless local area network (WLAN) such as Wi-Fi, a wireless personal area network (WPAN) such as Bluetooth, wireless universal serial bus (USB), ZigBee, NFC, radio frequency identification (RFID), power line communication (PLC), or a mobile cellular network such as 3G, 4G, or LTE. The Bluetooth interface may support Bluetooth low energy (BLE).

Specifically, the IoT device 1000 may include a communication interface 1200 (i.e., radio transmitter/receiver) for communicating with the outside. The communication interface 1200 may be a modem communication interface that is connectible to a wired LAN, a wireless local area communication interface, such as Bluetooth, Wi-Fi, or ZigBee, a PLC, or a mobile communication network, such as 3G or LTE. The communication interface 1200 may include a transmitter and/or a receiver. The IoT device 1000 may transmit and/or receive information from an access point or a gateway through the transmitter and/or the receiver. In addition, the IoT device 1000 may communicate with a user device or another IoT device to transmit and/or receive control information of the IoT device 1000 or data.

In the present example embodiment, the transmitter included in the communication interface 1200 may transmit a transmission signal through a plurality of frequency bands by using Carrier Aggregation (CA). To this end, the transmitter may include a plurality of power amplifiers for power-amplifying a plurality of RF input signals corresponding to a plurality of carriers, and a supply modulator for providing a power supply voltage to the plurality of power amplifiers. The supply modulator may be implemented according to the example embodiments described above with reference to FIGS. 1 to 14.

Specifically, the supply modulator may include an SIMO converter and at least one modulation circuit having a hybrid structure. Based on a plurality of output voltages of the SIMO converter, modulation voltages, that is, power supply voltages, may be provided to a plurality of power amplifiers. For example, at least one of the plurality of output voltages of the SIMO converter may be provided as a power supply voltage to at least one modulation circuit, and a modulation voltage generated from the modulation circuit may be provided as a power supply voltage to at least one power amplifier. In addition, in an example embodiment, at least one of the plurality of output voltages of the SIMO converter may be applied as the power supply voltage of a power amplifier.

The IoT device 1000 may further include a processor or an application processor 1100 for performing operations. The IoT device 1000 may further include an embedded battery for supplying an internal power or a power supplier that receives power from outside. In addition, the IoT device 1000 may include a display 1400 for displaying an internal state or data. The user may control the IoT device 1000 through a user interface (UI) of the display 1400. The IoT device 1000 may transmit an internal state and/or data to the outside through the transmitter and may receive a control command and/or data from the outside through the receiver.

The memory 1300 may store a control command code for controlling the IOT device 1000, control data, or user data. The memory 1300 may include at least one selected from a volatile memory and a non-volatile memory. The non-volatile memory may include at least one of various memories such as Read Only Memory (ROM), Programmable ROM (PROM), Electrically Programmable ROM (EPROM), Electrically Erasable and Programmable ROM (EEPROM), a flash memory, Phase-change RAM (PRAM), Magnetic RAM (MRAM), Resistive RAM (ReRAM), and Ferroelectric RAM (FRAM). The volatile memory may include at least one of various memories such as Dynamic RAM (DRAM), Static RAM (SRAM), and Synchronous DRAM (SDRAM).

The IoT device 1000 may further include a storage device. The storage device may be a nonvolatile medium such as a hard disk (HDD), a solid state disk (SSD), an embedded multimedia card (eMMC), or a universal flash storage (UFS). The storage device may store information of a user, provided through an input/output (I/O) unit 1500, and sensing information collected through a sensor 1600.

Figure 16:
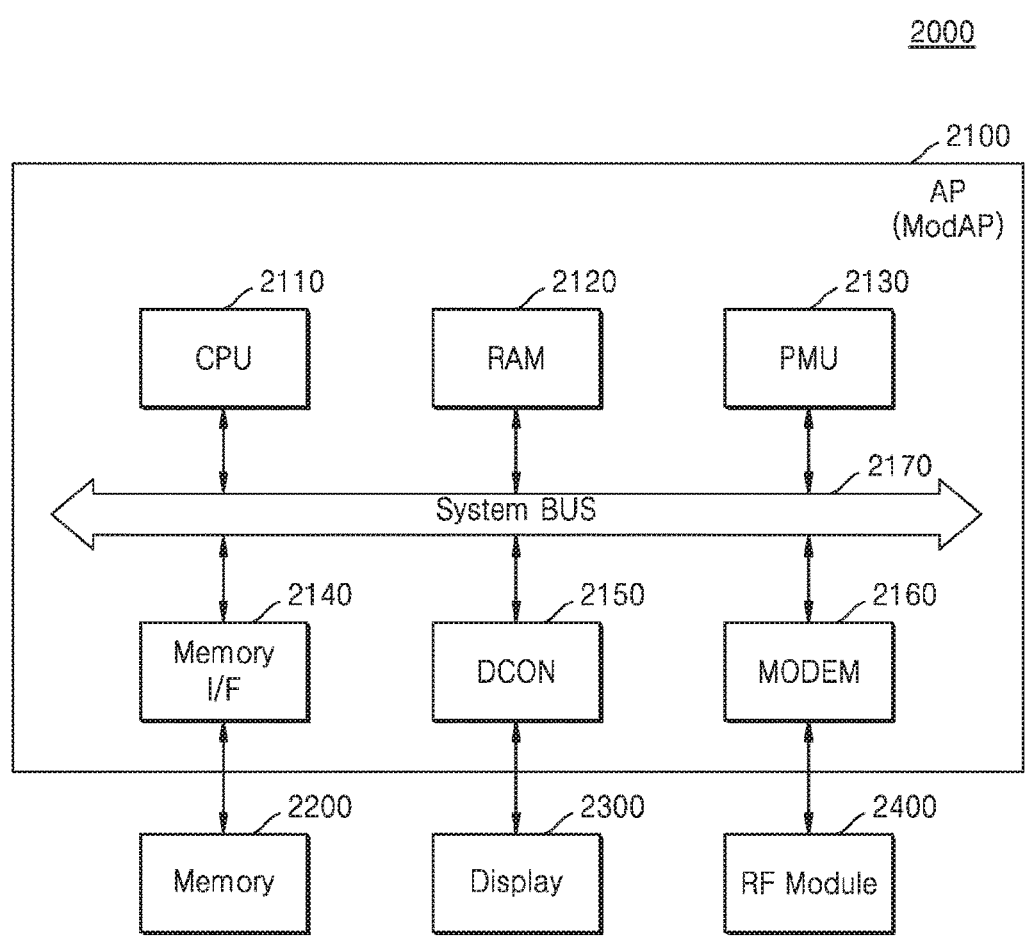
FIG. 16 is a block diagram of a mobile terminal according to an embodiment.

FIG. 16 is a block diagram of a mobile terminal 2000 according to an example embodiment.

Referring to FIG. 16, the mobile terminal 2000 may include an application processor 2100 (hereinafter referred to as an AP), a memory 2200, a display 2300, and an RF module 2400. In addition, the mobile terminal 2000 may further include various components such as a lens, a sensor, and an audio module.

The AP 2100 may be implemented as a system on chip (SoC) and include a central processing unit (CPU) 2110, an RAM 2120, a power management unit (PMU) 2130, a memory interface 2140, a display controller 2150, a modem 2160, and a bus 2170.

The AP 2100 may further include various IPs. The AP 2100 may be referred to as "ModAP" as a function of a modem chip is integrated therein.

The CPU 2110 may control the overall operations of the AP 2100 and the mobile terminal 2000. The CPU 2110 may control the operation of each component of the AP 2100. In an example embodiment, the CPU 2110 may be implemented as a multi-core. The multi-core is a computing component having two or more independent cores.

The RAM 2120 may temporarily store programs, data, or instructions. For example, programs and/or data stored in the memory 2200 may be temporarily stored in the RAM 2120 according to the control of the CPU 2110 or a booting code. The RAM 2120 may be implemented as DRAM or SRAM.

The PMU 2130 may manage the power of each component of the AP 2100. The PMU 2130 may also determine an operational status of each component of the AP 2100 and control the operation of the component.

The memory interface 2140 may control the overall operation of the memory 2200 and may control the exchange of data between each component of the AP 2100 and the memory 2200. The memory interface 2140 may write data to the memory 2200 or read data from the memory 2200 at the request of the CPU 2110.

The display controller 2150 may transmit image data to be displayed on the display 2300 to the display 2300. The display 2300 may be implemented as a flat panel display or flexible display, such as a liquid crystal display (LCD) and an organic light emitting diode (OLED).

For wireless communication, the modem 2160 may modulate data to be transmitted, in order to suit a wireless environment, and may recover received data. The modem 2160 may perform digital communication with the RF module 2400.

The RF module 2400 may convert a high frequency signal received via an antenna into a low frequency signal and transmit the low frequency signal to the modem 2160. The RF module 2400 may convert a low frequency signal received from the modem 2160 into a high frequency signal and transmit the high frequency signal to the outside of the mobile terminal 2000 via the antenna. The RF module 2160 may also amplify or filter a signal.

In the present example embodiment, the RF module 2160 may transmit a transmission signal through a plurality of frequency bands by using Carrier Aggregation (CA). To this end, the RF module 2160 may include a plurality of power amplifiers for power-amplifying a plurality of RF input signals corresponding to a plurality of carriers, and a supply modulator for providing a power supply voltage to the plurality of power amplifiers. The supply modulator may be implemented according to any one of the example embodiments described above with reference to FIGS. 1 to 14. Specifically, the supply modulator may include an SIMO converter and at least one modulation circuit having a hybrid structure. Based on a plurality of output voltages of the SIMO converter, modulation voltages, that is, power supply voltages, may be provided to the plurality of power amplifiers. Accordingly, the mobile terminal 2000 may perform broadband communication while reducing power consumption for communication.

While aspects of example embodiments have been particularly shown and described, it will be understood that various changes in form and details may be made therein without departing from the spirit and scope of the following claims.

What is claimed is:

1. A supply modulator for providing a first power supply voltage and a second power supply voltage to a first power amplifier and a second power amplifier, respectively, which operate simultaneously, the supply modulator comprising:
a first modulation circuit comprising a linear regulator and a switching regulator, the first modulation circuit being configured to generate a first modulation voltage in accordance with envelope tracking, and provide the first modulation voltage to the first power amplifier as the first power supply voltage; and
a single inductor multiple output (SIMO) converter configured to generate a first output voltage and a second output voltage based on an input voltage having a fixed level, provide the first output voltage to the linear regulator of the first modulation circuit, and provide the second output voltage to the second power amplifier as the second power supply voltage.

2. The supply modulator of claim 1, wherein the SIMO converter is further configured to dynamically step-down the input voltage or boost the input voltage.

3. The supply modulator of claim 1, wherein the SIMO converter is further configured to generate the first output voltage and the second output voltage on a time-division basis, step-down or boost the input voltage during a first phase to generate the first output voltage, and step-down or boost the input voltage during a second phase to generate the second output voltage.

4. The supply modulator of claim 1, wherein the SIMO converter is further configured to modulate a level of the first output voltage based on a first reference voltage and modulate a level of the second output voltage based on a second reference voltage,
wherein the first reference voltage is generated based on an amplitude component of a first transmission signal provided to the first power amplifier, and the second reference voltage is generated based on an amplitude component of a second transmission signal provided to the second power amplifier.

5. The supply modulator of claim 4, wherein the first reference voltage is generated based on a peak level of an envelope of the first transmission signal per transmission time interval (TTI), and the second reference voltage is generated based on a peak level of an envelope of the second transmission signal per TTI.

6. The supply modulator of claim 4, wherein the SIMO converter comprises:
a buck-boost converter comprising an inductor and a plurality of switches coupled to the inductor; and
a controller configured to output switch control signals to control states of the plurality of switches.

7. The supply modulator of claim 6, wherein the controller is further configured to generate the switch control signals based on the first reference voltage and the second reference voltage.

8. The supply modulator of claim 1, wherein, the first modulation circuit is further configured to generate the first power supply voltage as a sum of an output of the linear regulator and an output of the switching regulator in accordance with envelope tracking.

9. The supply modulator of claim 1, wherein, the first modulation circuit is further configured to selectively generate the first modulation voltage in accordance with envelope tracking and average power tracking, and
the first modulation circuit is further configured to turn off the linear regulator and generate the first power supply voltage using the switching regulator in accordance with average power tracking.

10. The supply modulator of claim 1, wherein, the first modulation voltage is selectively generated in accordance with envelope tracking and average power tracking, and
the first modulation circuit is turned off and the SIMO converter provides the first output voltage as the first power supply voltage in accordance with average power tracking.

11. The supply modulator of claim 1, wherein the SIMO converter is further configured to provide the second power supply voltage in accordance with average power tracking.

12. The supply modulator of claim 1, wherein the SIMO converter is further configured to generate a third output voltage and provide the third output voltage to a third power amplifier as a third power supply voltage.

13. The supply modulator of claim 1, wherein the SIMO converter is further configured to generate a third output voltage and provide the third output voltage to a radio frequency (RF) module configured to provide RF signals to the first power amplifier and the second power amplifier.

14. A supply modulator comprising:
a plurality of modulation circuits configured to generate a plurality of modulation voltages provided as power supply voltages to a plurality of power amplifiers, each of the plurality of modulation circuits comprising a linear regulator and a switching regulator which are used for power modulation according to envelope tracking; and
a single inductor multiple output (SIMO) converter configured to generate a first output voltage of a plurality of output voltages by direct current/direct current (DC/DC) conversion of a first input voltage and a second output voltage by DC/DC conversion of a second input voltage on a time-division basis and provide the first output voltage as a power supply voltage to the linear regulator of a corresponding modulation circuit of the plurality of modulation circuits.

15. The supply modulator of claim 14, wherein, the supply modulator is further configured to turn off a modulation circuit among the plurality of modulation circuits, and provide a power supply voltage to one of the plurality of power amplifiers corresponding to the modulation circuit using the SIMO converter.

16. The supply modulator of claim 14, wherein the SIMO converter is further configured to directly provide the second output voltage to one of the plurality of power amplifiers as a power supply voltage.

17. A modulation circuit configured to provide a power supply voltage to an amplifier, the modulation circuit comprising:
a linear regulator configured to receive an output voltage from a single inductor multiple output (SIMO) converter;
a comparator configured to sense an output current of the linear regulator and generate a comparison result;
a multiplexer configured to selectively output, as an output of the multiplexer, one among a reference voltage and the comparison result based on a mode signal; and
a switch controller configured to control an output current of the modulation circuit based on the an output of the multiplexer.

18. The modulation circuit of claim 17, wherein the multiplexer is further configured to select the reference voltage as the output of the multiplexer based on the mode signal indicating an APT mode, and select the comparison result as the output of the multiplexer based on the mode signal indicating an ET mode.

19. The modulation circuit of claim 18, wherein the linear regulator is further configured to receive an envelope signal.

20. The modulation circuit of claim 19, wherein the linear regulator is a linear amplifier,
the envelope signal comprises a positive signal and a negative signal, and
a positive terminal of the linear amplifier is configured to receive the positive signal, and
a negative terminal of the linear amplifier is configured to receive the negative signal.

* * * * *